United States Patent
Kumar et al.

(10) Patent No.: US 12,367,943 B2
(45) Date of Patent: Jul. 22, 2025

(54) REFERENCE VOLTAGE ADJUSTMENT PER PATH FOR HIGH SPEED MEMORY SIGNALING

(71) Applicant: Intel Corporation, Santa Clara, CA (US)

(72) Inventors: Arvind Kumar, Palo Alto, CA (US); Dean-Dexter R. Eugenio, Folsom, CA (US); John R. Goles, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 686 days.

(21) Appl. No.: 17/359,442

(22) Filed: Jun. 25, 2021

(65) Prior Publication Data

US 2021/0327524 A1    Oct. 21, 2021

(51) Int. Cl.
G11C 29/00 (2006.01)
G06N 20/00 (2019.01)
G11C 29/10 (2006.01)
G11C 29/12 (2006.01)

(52) U.S. Cl.
CPC ............ G11C 29/10 (2013.01); G06N 20/00 (2019.01); G11C 29/12005 (2013.01)

(58) Field of Classification Search
CPC ... G11C 5/147; G11C 29/12005; G11C 29/10; G06N 20/00
See application file for complete search history.

(56) References Cited

U.S. PATENT DOCUMENTS

| | | | |
|---|---|---|---|
| 8,089,813 B2 * | 1/2012 | Dreps | G11C 5/063 365/185.2 |
| 8,547,135 B1 * | 10/2013 | Yarlagadda | H03K 19/177 326/38 |
| 8,599,967 B2 * | 12/2013 | Hollis | H04L 25/061 375/317 |
| 9,046,909 B2 * | 6/2015 | Leibowitz | G11C 29/028 |
| 9,373,365 B2 | 6/2016 | Mozak et al. | |
| 9,401,721 B1 * | 7/2016 | Barakat | H04L 7/033 |
| 10,496,309 B2 | 12/2019 | Eugenio et al. | |
| 11,482,262 B1 * | 10/2022 | Lee | G11C 7/1048 |
| 11,483,185 B1 * | 10/2022 | Gugwad | H04L 25/03146 |
| 11,545,196 B2 * | 1/2023 | Lee | G11C 7/109 |
| 11,580,048 B1 * | 2/2023 | Wilson | G06F 9/3004 |
| 11,829,281 B2 * | 11/2023 | Lee | G06F 18/214 |

OTHER PUBLICATIONS

Ex parte Quayle Office Action for U.S. Appl. No. 17/359,423, Mailed Aug. 15, 2024, 4 pages.

* cited by examiner

*Primary Examiner* — Esaw T Abraham
(74) *Attorney, Agent, or Firm* — Compass IP Law PC

(57) ABSTRACT

In a memory system, receiver reference voltage adjustment per path provides the capability to adjust receiver reference voltages on a per path basis. Adjustment of receiver reference voltages for the memory device to an optimal receiver reference voltage per path is accomplished with dedicated mode registers and a local receiver voltage reference adjuster circuit in the memory device for each data path. The optimal receiver reference voltage is determined during training based on selected feedback per path from the memory device. The dedicated mode registers contain adjustment values that were previously programmed during training, and include adjustments steps to add to or subtract from a global receiver reference voltage for all paths until reaching the optimal receiver reference voltage for a current path.

24 Claims, 15 Drawing Sheets

600 - Example of mode registers per Data Path (or per Unit Interval):
Local Rx VrefDQ Adjuster for DQ0 Data Path A and Data Path B

| Function | Register Type | Operand | Data |
|---|---|---|---|
| Rx VrefDQ Adjustment for DQ0 Data Path A | R/W | OP[2:0] | 111b: Rx VrefDQ Adjustment Step 7<br>110b: Rx VrefDQ Adjustment Step 6<br>101b: Rx VrefDQ Adjustment Step 5<br>100b: Rx VrefDQ Adjustment Step 4<br>011b: Rx VrefDQ Adjustment Step 3<br>010b: Rx VrefDQ Adjustment Step 2<br>001b: Rx VrefDQ Adjustment Step 1<br>000b: Rx VrefDQ Adjustment Step 0 |
| Sign Bit Rx VrefDQ Adjustment for DQ0 Data Path A | R/W | OP[3] | 0b: Positive Rx VrefDQ Adjustment (Default)<br>01: Negative Rx VrefDQ Adjustment |
| Rx VrefDQ Adjustment for DQ0 Data Path B | R/W | OP[6:4] | 111b: Rx VrefDQ Adjustment Step 7<br>110b: Rx VrefDQ Adjustment Step 6<br>101b: Rx VrefDQ Adjustment Step 5<br>100b: Rx VrefDQ Adjustment Step 4<br>011b: Rx VrefDQ Adjustment Step 3<br>010b: Rx VrefDQ Adjustment Step 2<br>001b: Rx VrefDQ Adjustment Step 1<br>000b: Rx VrefDQ Adjustment Step 0 |
| Sign Bit Rx VrefDQ Adjustment for DQ0 Data Path B | R/W | OP[7] | 0b: Positive Rx VrefDQ Adjustment (Default)<br>01: Negative Rx VrefDQ Adjustment |

FIG. 6A

610 - Example adjustment steps per Data Path (or per Unit Interval) by Rx VrefDQ Adjuster ←------------------- Rx VrefDQ (local)* -------------------→

| Rx VrefDQ Adjuster Path A | Rx VrefDQ Adjuster Path B | Rx VrefDQ Adjuster Path C | Rx VrefDQ Adjuster Path D |
|---|---|---|---|
| Step +n | Step +n | Step +n | Step +n |
| ... | ... | ... | ... |
| Step +3 | Step +3 | Step +3 | Step +3 |
| Step +2 | Step +2 | Step +2 | Step +2 |
| Step +1 | Step +1 | Step +1 | Step +1 |
| Step 0 | Step 0 | Step 0 | Step 0 |
| Step -1 | Step -1 | Step -1 | Step -1 |
| Step -2 | Step -2 | Step -2 | Step -2 |
| Step -3 | Step -3 | Step -3 | Step -3 |
| ... | ... | ... | ... |
| Step -n | Step -n | Step -n | Step -n |

Rx VrefDQ (global)

612 — Local Rx VrefDQ Adjustment step size is 2mV

FIG. 6B

REFERENCE VOLTAGE ADJUSTMENT PER PATH FOR HIGH SPEED MEMORY SIGNALING

FIELD

Descriptions are generally related to high speed memory signaling, and more particular descriptions are related to reference voltage training and adjustment for memory devices that support high speed memory signaling.

BACKGROUND

In memory devices that support high speed memory signaling the clock speed of the signaling used to exchange the data between the processor and the memory results in increased data rates. However, at data rates greater than approximately 3200 MT/s (mega-transfers per second), signal degradation can increase due to inter symbol interference (ISI). Evidence of signal degradation manifests in the data eye. The data eye refers to average phase of the rising and falling edges of signals sent across the signal lines interconnecting the devices. The data eye should have a consistent gap where transitioning of the input/output (I/O) signaling does not occur. Closure of the data eye occurs when the timing and voltage margins are tight enough that certain interference conditions can cause inconsistency in the signaling, making the average time of rising edges so close to the average time of falling edges that it is too close to correctly sample and distinguish a signal bit.

One way to improve the operation of memory devices that support high speed memory signaling is to train or otherwise adjust certain settings for voltages, currents, termination, phase compensation (e.g., delay locked loops), and the like until signaling settings are determined that help to maintain the data eye width and meet an expected bit error rate (BER) for the data being exchanged. BER goals can be on the order of 10-16 or 10-18 or better.

For example, settings for reference voltage (Vref) values for receiver reference voltages (Rx Vref) and transmitter reference voltages (Tx Vref) and signal timing delays can be trained to optimize the exchange of data between the processor and the memory without errors or with fewer errors that would otherwise be achieved.

Training entails sending a known set of data from a host to the memory using test settings and then obtaining feedback, including the data retrieved from the memory, to evaluate the accuracy of the data exchange. For example, the host or a host component, such as a memory controller, issues write commands for the data to be sent to the memory device and stored in the memory array (or otherwise processed in a functional block of the memory device). Subsequently, the host receives feedback, including the retrieval of the data from the memory array.

A loopback process enables a host or a host component to receive feedback without having to access the data from the memory array. For example, standards for double data rate version 5 (DDR5) dynamic random access memory (DRAM) devices include improvements in loopback data output that enable data signals received by the memory device to be analyzed without accessing the data from the memory array (see JEDEC DDR5 Full Spec. Draft Rev. 0.99d).

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIGS. 6A-6B are tables of example mode register values and adjustment steps per path used in a process for receiver reference voltage adjustment per path for high speed memory signaling in accordance with described embodiments;

Figure 1:
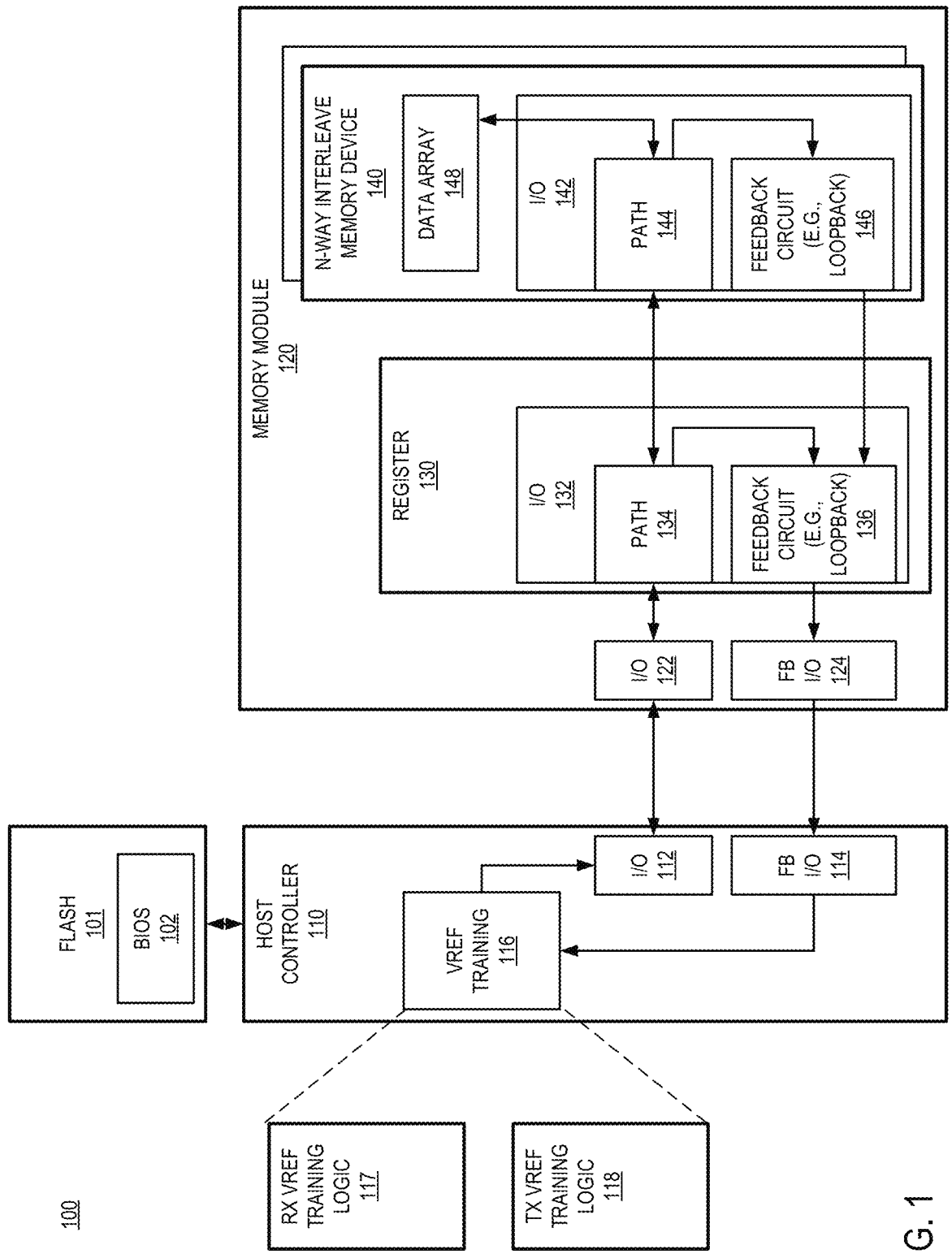
FIG. 1 is a block diagram of an example of a memory subsystem with a feedback circuit that enables reference voltage training and adjustment per path for high speed memory signaling in accordance with described embodiments.

Descriptions of certain details and implementations follow, including non-limiting descriptions of the figures, which may depict some or all examples, and well as other potential implementations.

DETAILED DESCRIPTION

N-way interleave memory devices, such as DDR5 devices, divide the input clock and data stream received from a host into "N" distinct paths before they are stored into the memory array internally. For example, in 2-way interleave devices, the data stream is divided into two data streams, each destined for a different path. If Path A is defined as "A" and path "B" is defined as "B", then the incoming data traffic of 10101010 from the host will present as ABABABAB. Inside the DRAM, the input data stream of ABABABAB is forwarded to the memory array as a stream of AAAAAAAA unit intervals (UIs) or BBBBBBBB UIs, where each UI is a transfer cycle of a sequence of data transfers exchanged over a data bus in a burst. If feedback is enabled, such as the loopback feature available in DDR5 devices, the divided data streams are forwarded to a multi-stage multiplexer for loopback.

When training a reference voltage, existing methods usually train the reference voltage values using an average across the ABABABAB (or, for 4-way memory devices, the ABCDABCD) data stream. This results in programming the same reference voltage value for all the different paths "A", "B", "C", and "D". However, due to differences in manufacturing variations, process technology, design, and the like, the different paths "A", "B", "C" and "D" can have slightly different electrical properties (impedance, inductance, bias, etc.) resulting in a different effective reference voltage value for each path.

As described herein, embodiments of reference voltage training and adjustment per path provides the capability to train and adjust the reference voltages of each different data path to its optimum effective reference voltage value using the feedback for the divided data streams, i.e. using the feedback per path. Similar improvements can be applied to training input timing delays.

Using the feedback per path to train reference voltage values, adjuster values and timing delays in accordance with the described embodiments can result in improved voltage and timing margins in the memory device, including improved tolerance to smaller input voltage swing, input jitter, ISI etc. Such improved performance characteristics can increase system performance to operate at a higher speed bin or same speed bin but with more memory devices on the same channel.

The feedback per path can be obtained from a loopback circuit or loopback logic implemented in a memory device, including in a memory module register, register clock driver, or a data buffer, or other functional block of the memory device or a combination. The loopback circuit can feed the received training (Write) data back out of the device to an external receiver, including a host memory controller or test instrument, to perform embodiments of reference voltage training and adjustment as described herein.

FIG. 1 is a block diagram of an example of a system 100 with a N-way interleave memory device 140 capable of dividing a data stream into N paths through the device, including a path 144 to the data array 148, a path 134 to the register 130 and other paths (not shown). The system 100 includes a feedback circuit, e.g. a memory component loopback circuit 136, 146. System 100 further includes host controller 110 coupled to memory module 120. Host controller 110 can represent a memory controller of the host processor or host SOC (system on a chip). Host controller 110 includes a reference voltage training logic 116, including a receiver reference voltage training logic 118 and a transmitter reference voltage training logic 118. Host controller 110 can represent a controller of a test system. As such, the reference voltage training logic 116 can be implemented in production testing or in a deployed memory system, or a combination.

The memory component can include register 130 of memory module 120, the N-way interleave memory device 140, or a buffer device, or other memory component, or multiple of these devices. Reference voltage training logic 116 can enable the host controller 110 to train reference voltage values based on feedback provided through the feedback circuit 136/146. Host controller 110 includes input/output interface (I/O) 112, which represents a data I/O to couple with N-way interleave memory device 140. Host controller 110 includes I/O 114, which represents a separate feedback I/O to receive the feedback from feedback circuit 136/146 (e.g., the loopback signals). Memory module 120 can include corresponding I/O 122 and feedback I/O 124. In one example, a memory component provides feedback data using I/O 124 to I/O 114 in response to a data signal received on I/O 122 from I/O 112.

In one example, register 130 includes I/O 132, which includes path 134 to the memory array or data array 148 of the N-way memory device 140. In one example, I/O 132 includes the feedback circuit 136 to provide feedback data separate from the data path 134 to the memory array. In one example, memory device 140 includes I/O 142, which includes path 144 to data array 148. In one example, I/O 142 includes loopback circuit 146 to provide loopback data separate from the data path to the data array 148. The feedback circuits 136/146 of I/O 132 and I/O 142 can provide feedback data in accordance with any example herein.

In one embodiment, system 100 includes flash device 102 or other nonvolatile storage device. In one example, flash 101 stores a basic input/output system (BIOS) 102 for system 100. For a memory subsystem in a computing device, the BIOS 102 can enable host controller 110 to provide testing or configuration of memory components, such as testing, initialization, or other configuration routine, including the reference voltage training logic 116. For a testing device, flash 101 can represent a test program for the testing system. It will be understood that a processor device will execute the BIOS 102 or test program, and is not explicitly illustrated in system 100. In one example, the BIOS 102 can cause the reference voltage training logic 116 to be performed or otherwise control the reference voltage training logic 116. In one example, the BIOS 102 performs the reference voltage training logic 116. In one example, the BIOS includes steps that include programming a local Rx Vref adjuster as described herein. In one example, the BIOS includes steps that include training any one or both of the receiver reference voltages and the transmitter reference voltages. In one example, the BIOS includes steps that include training timing delays for use with trained reference voltages. The reference voltage training logic 116 can include a receiver reference voltage (Rx Vref) training logic 117 and a transmitter reference voltage (Tx Vref) training logic 118.

Figure 2:
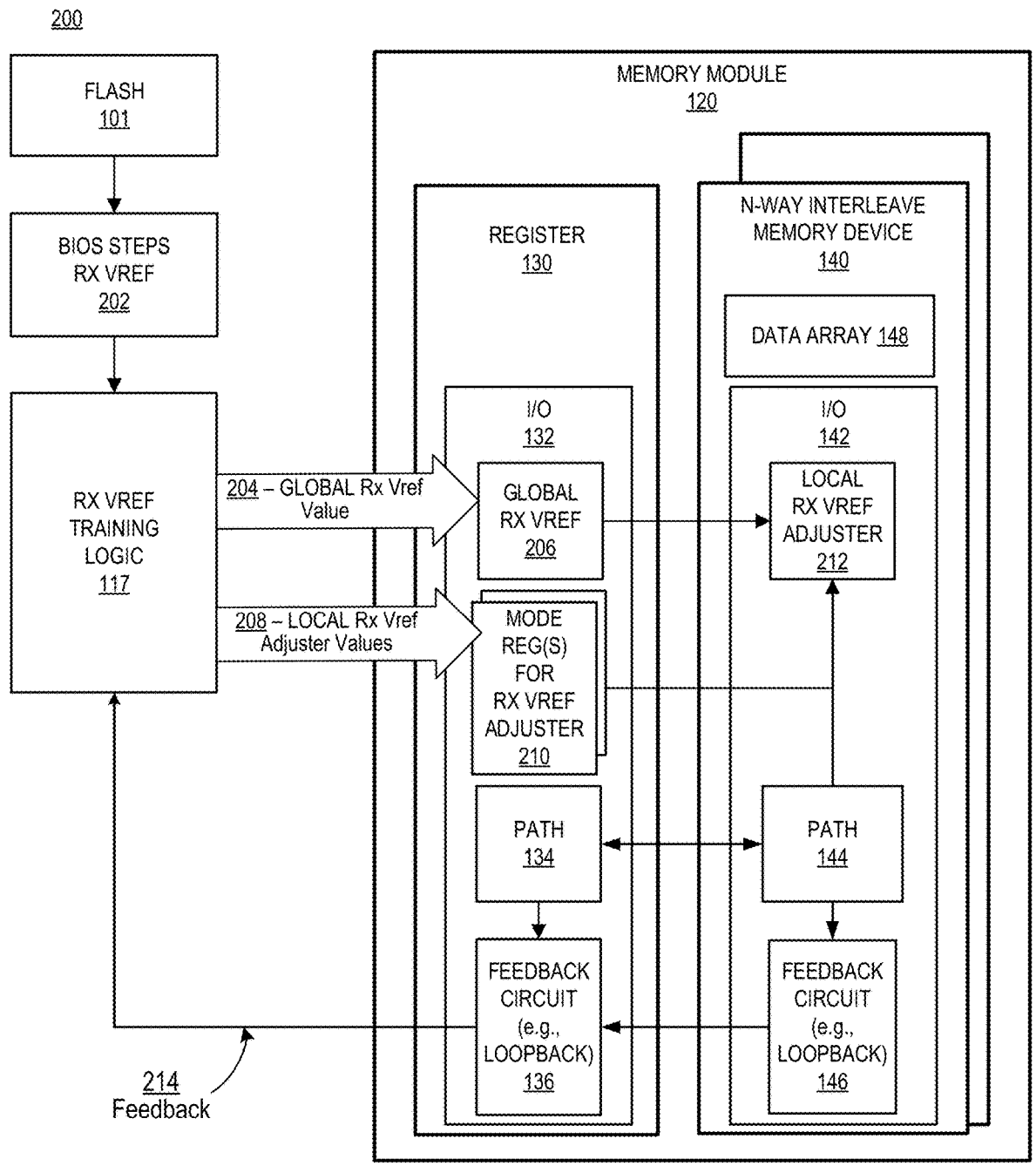
FIG. 2 is a block diagram of an example of a memory subsystem that enables receiver reference voltage training and adjustment per path for high speed memory signaling in accordance with described embodiments.

FIG. 2 is a block diagram of an example of a memory subsystem 200 that enables receiver reference voltage (Rx Vref) training and adjustment per path, e.g., path 134, 144, through implementation of Rx Vref training logic 117 based on feedback 214 for a particular path. An example of system 200 includes a memory module 120 which includes one or more N-way interleave memory devices 140 and other components as described in FIG. 1, including I/O circuitry 132/42 for a data signal (DQ) and a command/address (CA) signal.

The Rx Vref training logic 117 can include an input voltage margin logic 204 that trains a global Rx Vref value and local Rx Vref adjuster values to fine tune the Rx Vref values for a particular path. Thus, one output of the training logic 117 includes a trained global Rx Vref value 204 used by memory module 120 to set the global Rx Vref 206 for a particular data or command/address signal (DQ0, DQ1, ... CA1, CA2). Another output of the training logic includes one or more local Rx Vref adjuster values 208.

For example, in some embodiments, when training Rx Vref values, each data path's Rx Vref can be optimized by using a local Rx Vref adjuster circuit 212 to adjust and optimize a local Rx Vref setting per path. The local Rx Vref adjuster circuit 212 is capable of adjusting the local Rx Vref for a path based on the values programmed in the set of dedicated mode registers 210 during training. Embodiments of reference voltage training and adjustment described herein can program the set of dedicated mode registers 210 with trained Rx Vref adjuster values 208 per path for a given data signal, e.g. DQ0/Path A, DQ0/PathB, DQ1/PathA, DQ1/Path B, or for a given command/address signal, e.g. CA1/PathA, CA2/PathB, and so forth. An N-way interleave memory device 140 can subsequently adjust the Rx Vref setting for a particular path to the optimal Rx Vref setting for that path using the trained Rx Vref adjuster values per path as programmed in the dedicated mode registers as described in more detail in FIGS. 5 and 6A-6B below.

Figure 3:
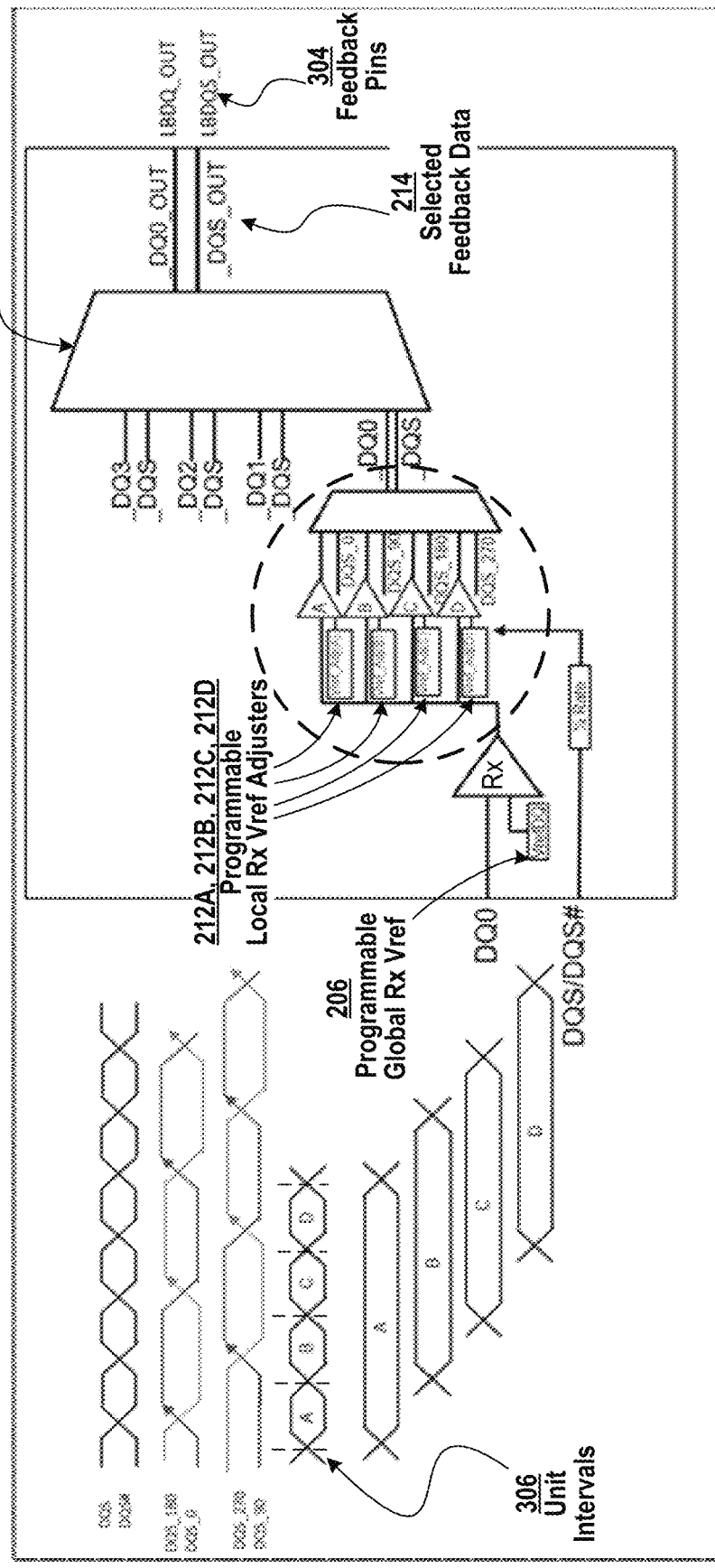
FIG. 3 is a block diagram of an example of a 4-way interleave circuit on a memory device that enables receiver reference voltage training and adjustment per path for high speed memory signaling in accordance with described embodiments.

FIG. 3 is a block diagram of an example of a 4-way interleave circuit on an X4 DRAM with programmable global Rx Vrefs 206 set for each data signal (e.g., DQ0, DQ1, CA1, CA2) and programmable local Rx Vref adjuster circuits 212A, 212B, 212C, 212D for each data path (e.g., A, B, C, D) within a data signal. As shown, a data stream can interleave four unit intervals (UIs), each divided into its own data stream destined for a corresponding data path A, B, C or D.

To perform the training, a host or test system drives DQS/DQS # and DQ (or CA1, CA2) to the memory device. As noted earlier, the input DQ (or CA) data stream from the host/test system to the memory device can be described as a sequence of ABCDABCD data where A is the first UI, B is the second UI, C is the third UI and D is the fourth UI. The N-way interleave memory device can divide the incoming traffic into two or more distinct data paths. On memory devices that implement 2-way interleave the data path is divided into two, i.e., data path A and data path B rather than the four data paths, i.e., data path A, B, C, and D shown in FIG. 3. This data path can lead to different functional blocks in the memory device, including the feedback selector mux 302.

A host can proceed with training to find the optimum Rx Vref per data path using selected feedback per data path, such as loopback data. For example, a host can enable loopback and train for data path A using the loopback data from data path A, train for data path B using the loopback data from data path B, train for data path C using the loopback data from data path C, and lastly train for data path D using the loopback data from data path D.

In one embodiment, selected feedback data 214, such as loopback data, is fed back to the test system and/or memory controller via feedback pins 304. Once training is complete, the trained optimal global Rx Vref values for the data signal are used to program the corresponding global Rx Vrefs 206. In addition, the local Rx Vref Adjusters 212A, 212B, 212C and 212D, are each programmed using a dedicated set of mode registers to enable the memory device to subsequently adjust the local Rx Vref values to the optimum effective value for the corresponding data path A, B, C or D.

Figure 4A:
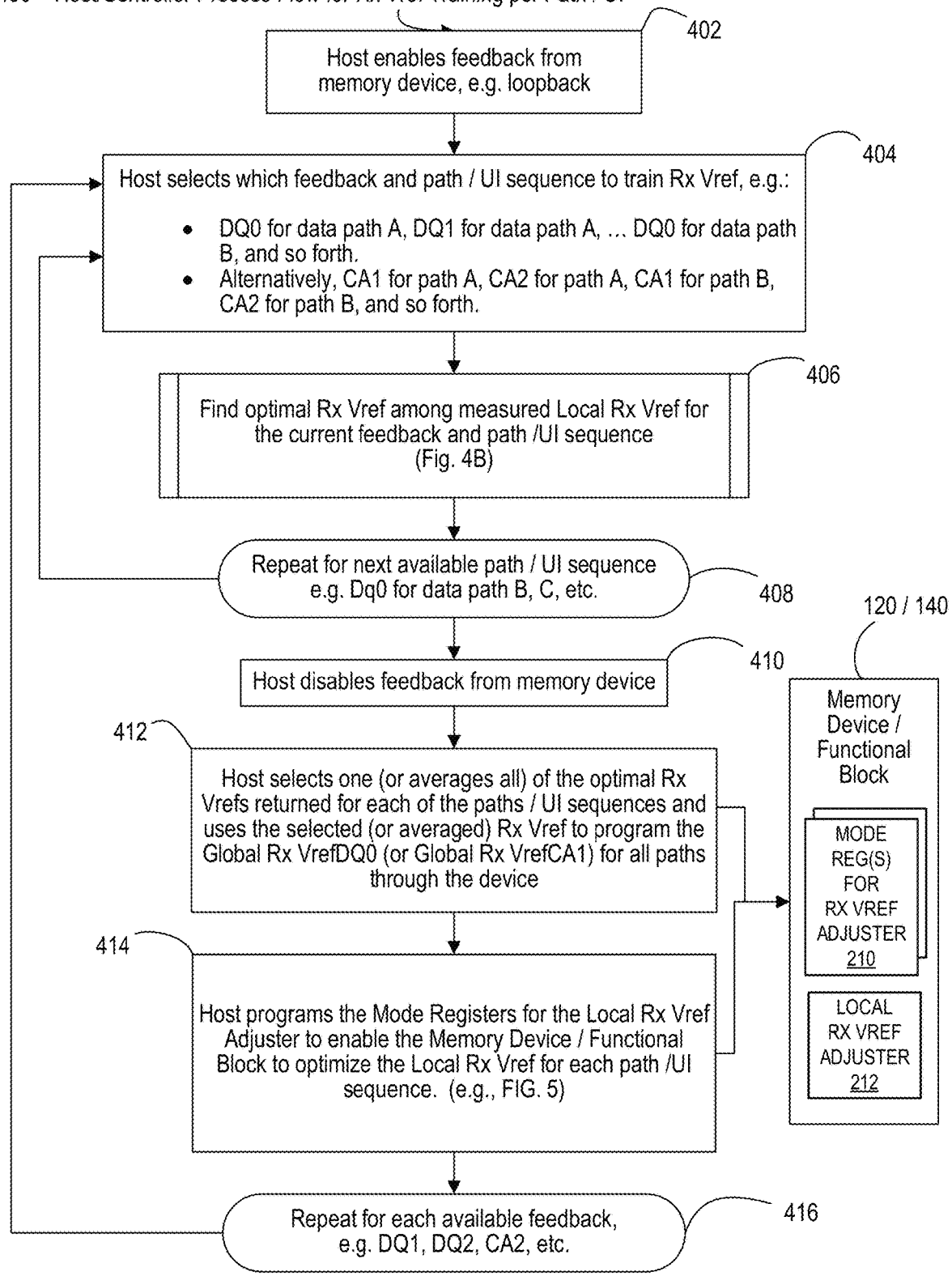
FIGS. 4A-4B are flow diagrams of an example of a process for receiver reference voltage training per path for high speed memory signaling in accordance with described embodiments.
Figure 4B:
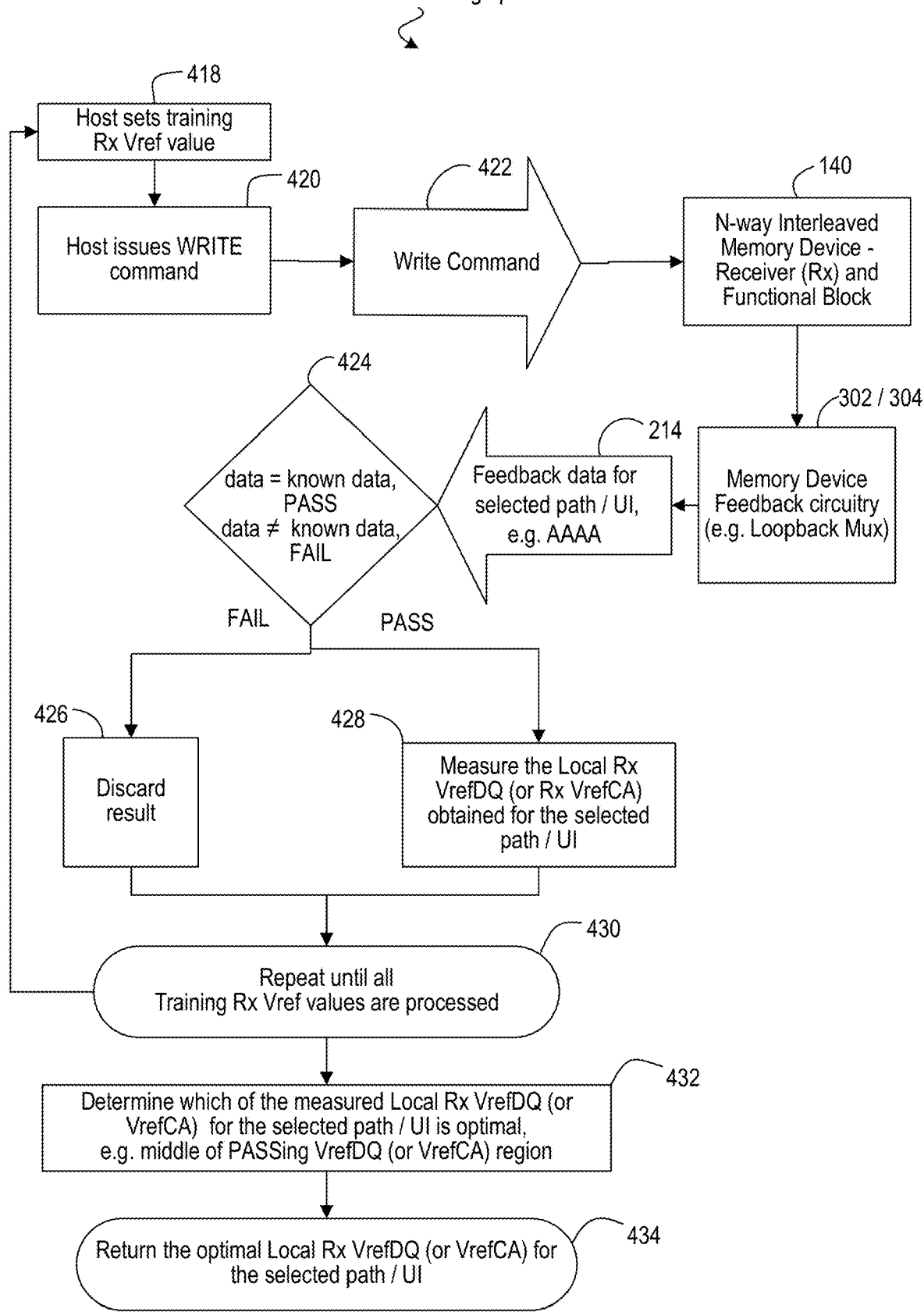

FIGS. 4A-4B are flow diagrams of an example of a process 400 for receiver reference voltage training per path for high speed memory signaling in accordance with described embodiments. In the descriptions that follow it should be understood that references to a host can include a host component of a memory device or a test device. In FIG. 4A, at 402, a host enables feedback from the memory device for which training is to commence. For example, the host component can enable a loopback feature on the memory device.

At 404, the host selects which feedback and path to use to train the corresponding Rx Vrefs. For example, the host can select feedback for data signal DQ0 for data path A, DQ1 for data path A, . . . DQ0 for data path B, and so forth. Alternatively, the host can select feedback for command/address signal CA1 for path A, CA2 for path A, CA1 for path B, CA2 for path B, and so forth. At 406, a process commences to find an optimal Rx Vref among measured local Rx Vrefs for the selected feedback/path combination as described in further detail in FIG. 4B. At 408, the processes at 404 and 406 are repeated for each of the feedback/path combinations that are selected. At 410, after repeating the processes at 404 and 406 for all available feedback/path combinations, the host disables feedback from the memory device.

At 412 the host programs the global Rx Vrefs for each data signal and/or command/address signal for which feedback was obtained using the optimal Rx Vrefs per path that were found at 406. In some embodiments, the host selects the global Rx Vrefs from among the optimal Rx Vrefs per path that were found at 406, including averaging the optimal Rx Vrefs per path for a given data signal or command/address signal.

In one embodiment, at 414, the host can also program the mode registers 210 with Rx Vref adjuster values. The host determines the Rx Vref adjuster values during training based on the optimal Rx Vrefs that were found among measured local Rx Vrefs for the selected feedback/path combination at 406. Programming the mode registers 210 will enable the memory device to adjust the local Rx Vref of each distinct data path to its own optimum value. For example, the memory device (and/or a functional block within the memory device) circuit for a local Rx Vref adjuster 212 adjusts a local Rx Vref for each path through the memory device with Rx Vref adjuster values. In one embodiment, the host programs the Rx Vref adjuster values during training based on the optimal Rx Vrefs that were found at 406 (and as described in further detail in FIG. 5). At 416, the host repeats the entire process from 404 to 414 for each available feedback signal, e.g., DQ0, DQ1, DQ2, CA1, CA2, . . . and so forth.

In one embodiment, in FIG. 4B, at 418, the host process flow for finding the optimal Rx Vref values (process 406, FIG. 4A) begins at 418 in which the host sets a training Rx Vref value. At 420 the host commences training by issuing a WRITE command 422 to an N-way memory device 140. After passing through the receiver and interleave circuitry on the memory device, the memory device feedback circuitry 302/304 provides feedback data 214 for the selected path/UI, e.g., Path A for data stream AAAA. At decision block 424, the returned feedback data 214 is compared to the known data issued in the WRITE command 422 to determine if the returned data matched the known data (PASSed) or not (FAILed). Training that results is FAILed data is discarded at 426. Training that results in PASSed data is recorded at 428 to measure the local Rx Vref for the selected path/UI that resulted in the PASSed data. At 430, the training processes beginning at 418 are repeated until all training Rx Vref values have been processed.

In one embodiment, the host processes continue at 432 to determine which of the measured local Rx Vrefs for the selected path/UI that resulted in the PASSed data is the optimal local Rx Vref for the selected path/UI. In one embodiment, the host selects the local Rx Vref whose value falls in the middle of the PASSing region of measured local Rx Vrefs as the optimal local Rx Vref. Typically the Rx Vref that falls in the middle of the PASSing region will ensure the least number of errors in the data exchanged between the host and the memory device. In one embodiment, the host averages all of the local Rx Vrefs whose values are within the PASSing region to select the Rx Vref that best represents the middle of the PASSing region. At 434, the host process concludes by returning the optimal local Rx Vref for the selected path/UI.

Figure 5:
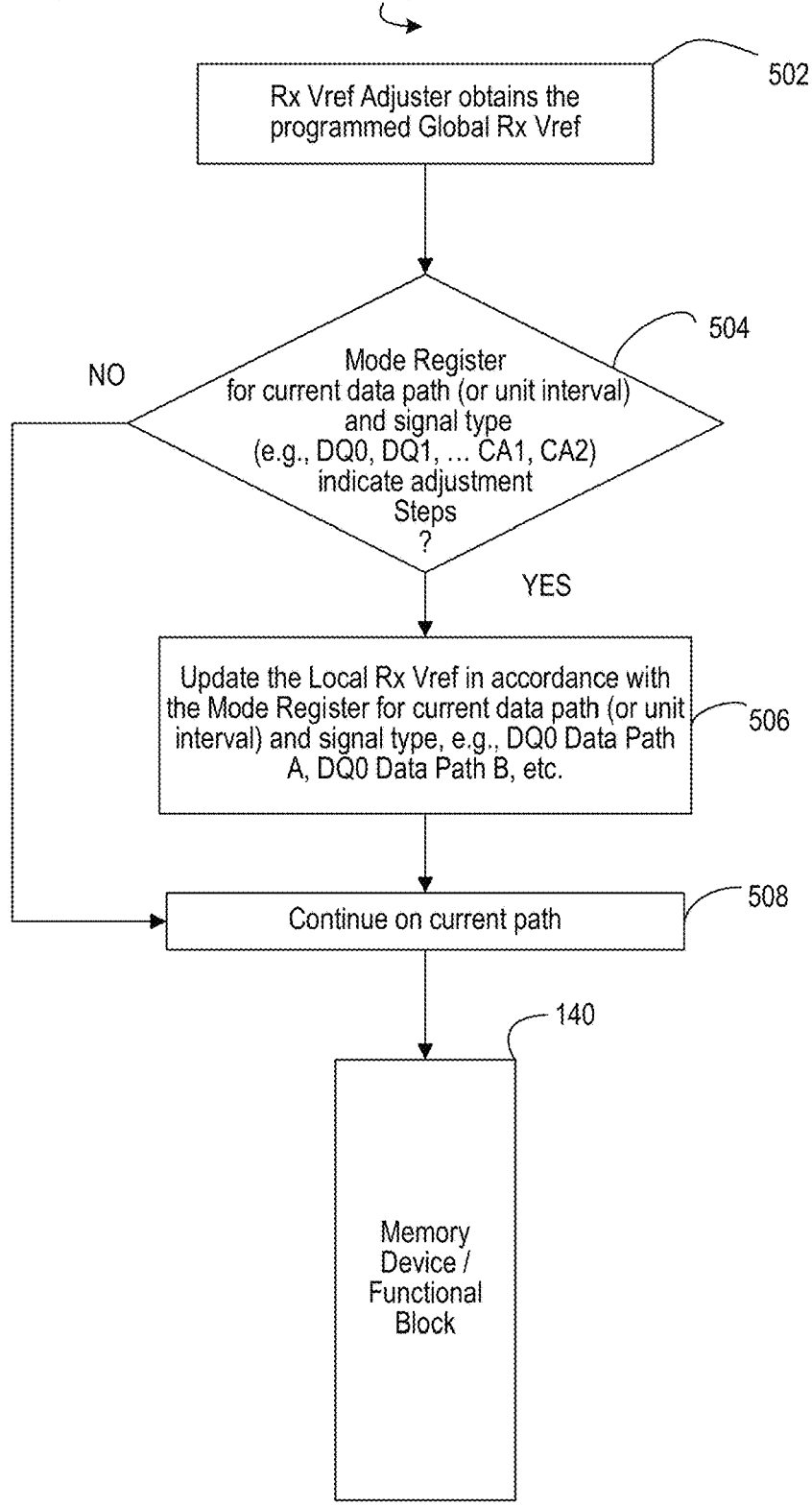
FIG. 5 is a flow diagram of an example of a process for receiver reference voltage adjustment per path for high speed memory signaling in accordance with described embodiments.

FIG. 5 is a flow diagram of an example of a process for local receiver reference voltage (local Rx Vref) adjustment per path for high speed memory signaling in accordance with described embodiments. Because different data paths in a memory device may exhibit different optimum Rx Vref values, each data path is provided with a Rx VrefDQ Adjuster that can be programmed to add or subtract to/from the global Rx Vref programmed for the current signal type. In one embodiment, the host not only programs the global Rx Vref value to use during training, but also programs the Rx Vref Adjuster circuit to add or subtract a certain amount to match the optimum local effective Rx Vref for each path found during training.

For example, after training is completed as described in FIGS. 4A-4B, in one embodiment, at 502, the Rx Vref adjuster circuit obtains the global Rx Vref programmed for the current signal type (e.g. DQ0, DQ1, . . . CA1, CA2, and the like). At decision block 504, the Rx Vref adjuster circuit determines whether the mode registers for the current data path/UI and signal type are programmed to indicate the presence of adjustment steps. If so, the Rx Vref adjuster circuit updates the local Rx Vref in accordance with the adjuster values in the mode registers for the current data path/UI and signal type. At 508, the divided data stream continues along the current path through the memory device functional block 140, but with the local Rx Vref adjusted to match the optimum local effective Rx Vref for found each path during training.

It should be noted that with reference to the processes described in flow diagrams FIGS. 4A-4B and FIG. 5, that all processes can be implemented for training and adjusting receiver reference voltages not just in DRAM but also in data buffers, register clock drivers (RCDs) and other functional blocks of a memory device.

To illustrate the training and adjustment of the global and local Rx Vref values, Table 1 contains example Rx VrefDQ values that could be measured for a typical memory device undergoing training in accordance with the described embodiments. As shown, the local optimum effective Rx VrefDQ measured for each data path during training are different, and they vary by as much as 18 mV (730-712 mV).

TABLE 1

|  | Measured local Rx VrefDQ | Unit |
| --- | --- | --- |
| Optimum Rx VrefDQ using Data Path A | 730 | mV |
| Optimum Rx VrefDQ using Data Path B | 712 | mV |
| Optimum Rx VrefDQ using Data Path C | 720 | mV |
| Optimum Rx VrefDQ using Data Path D | 716 | mV |
| Rx VrefDQ (rounded up average) | 720 | mV |

Using the above example values in Table 1, if the process for training and selecting the global Rx VrefDQ uses the average of the local optimum Rx VrefDQ values for each data path, then the global Rx VrefDQ for a particular signal type (e.g. DQ0) is set to 720 mV for the 4-way interleave memory device undergoing the training. During subsequent operation, adjuster values would have been programmed in the dedicated mode registers during training to enable the 4-way interleave memory device to adjust the local Rx VrefDQ and arrive at an effective local Rx VrefDQ for each data path as shown in the example values in Table 2. Note that the example values in the effective local Rx VrefDQ per data path in Table 2 matches the optimal effective Rx Vref DQ measured during training as shown in Table 1.

TABLE 2

|  | Programmed Rx VrefDQ (global) | Programmed Rx VrefDQ adjustment | Effective Rx VrefDQ (per data path) | Unit |
| --- | --- | --- | --- | --- |
| Rx VrefDQ for Data Path A | 720 | +10 | 730 | mV |
| Rx VrefDQ for Data Path B | 720 | −8 | 712 | mV |
| Rx VrefDQ for Data Path C | 720 | 0 | 720 | mV |
| Rx VrefDQ for Data Path D | 720 | −4 | 716 | mV |

FIGS. 6A-6B are tables of example mode register values and adjustment steps per path used in a process for receiver reference voltage adjustment per path for high speed memory signaling in accordance with described embodiments.

As shown in FIG. 6A, there are four values programmed in a mode register. In the example 600, there are two data paths, path A and path B, for which mode register values have been programmed. A function 602 indicates the signal type and data path for which the adjustment is indicated as well as the sign bit to use during adjustment. The corresponding register type 604, operand 606 and data 608 enable the local Rx Vref adjuster circuit 212 to perform the indicated adjustment per path as described in FIG. 5. Specifically, adjustment values in steps of predefined step size may be added or subtracted to/from the global Rx VrefDQ to arrive at the optimum effective Rx VrefDQ for each data path. In this manner, the Rx Vref adjuster circuit allows a host to cause a memory device to adjust the DRAM's internal Rx VrefDQ on a per data path (or per UI) basis to compensate for differences in each path's optimum Rx Vref values.

Example adjustments for path A and path B are shown in FIG. 6B. As illustrated in table 610, the adjustment for each path can be accomplished in the Rx Vref adjuster circuit 212 incrementally in steps of a predefined size. The adjustment step size can vary but is typically predefined to be a fixed value for the Rx Vref adjuster circuit 212, in this case the local Rx VrefDQ adjustment step size of 2 mV. As illustrated, the Rx Vref value is adjusted for each path using one or more of the steps in either a positive or negative direction as indicated in the mode register values of FIG. 6A.

Using the values tabulated in the example in Table 2, above, an adjustment of the Rx Vref for path A of +10 mV would require five adjustment steps of 2 mV in the positive direction relative to the programmed global Rx Vref value of 720 mV to arrive at an optimal effective Rx Vref value of 730 mV. On the other hand, an adjustment of the Rx Vref for path B of −8 mV would instead require four adjustment steps of 2 mV in the negative direction relative to the programmed global Rx Vref value of 720 mV to arrive at an optimal effect Rx Vref value of 712 mV.

Because the Rx Vref adjuster logic in the circuit 212 can exhibit slight changes in accuracy due to changes in temperature, if the change in accuracy is known from previous experiments, then the user can perform Rx Vref adjustment using pre-defined Rx Vref adjuster values in the mode registers 210. This can be helpful if the temperature has changed significantly enough (for example from 100 C to 90 C), because it allows the Rx Vref adjuster to perform accurately without having to retrain the Rx Vref adjuster values. One example scenario would be to train an Rx Vref at current case (external) temperature, Tcase. If Tcase changes by some value (say 10 C), then manually reprogram the Rx Vref adjuster values based on pre-defined values. Otherwise, if Tcase exceeds a certain change threshold, perform another Rx Vref training at the new Tcase temperature. Of course, Rx Vref can be adjusted separately per pin and per UI based on their characteristics and performance goals. Tcase is usually used as the temperature of the case of the device because it is easy to measure. A more accurate measurement is to use an internal temperature reading, such as Tjunction from inside the device, albeit more difficult to measure.

In another example use case, the Rx Vref adjuster logic in circuit 212 can be forced to a logic 0 or logic 1 value in some applications, such as during a test mode of operation, where a logic 0 or logic 1 is required regardless of the input voltage. By raising Vref high enough, a logic 0 will be forced in, and if Vref is lowered enough, a logic 1 will be forced into the Rx Vref adjuster circuit.

Figure 7:
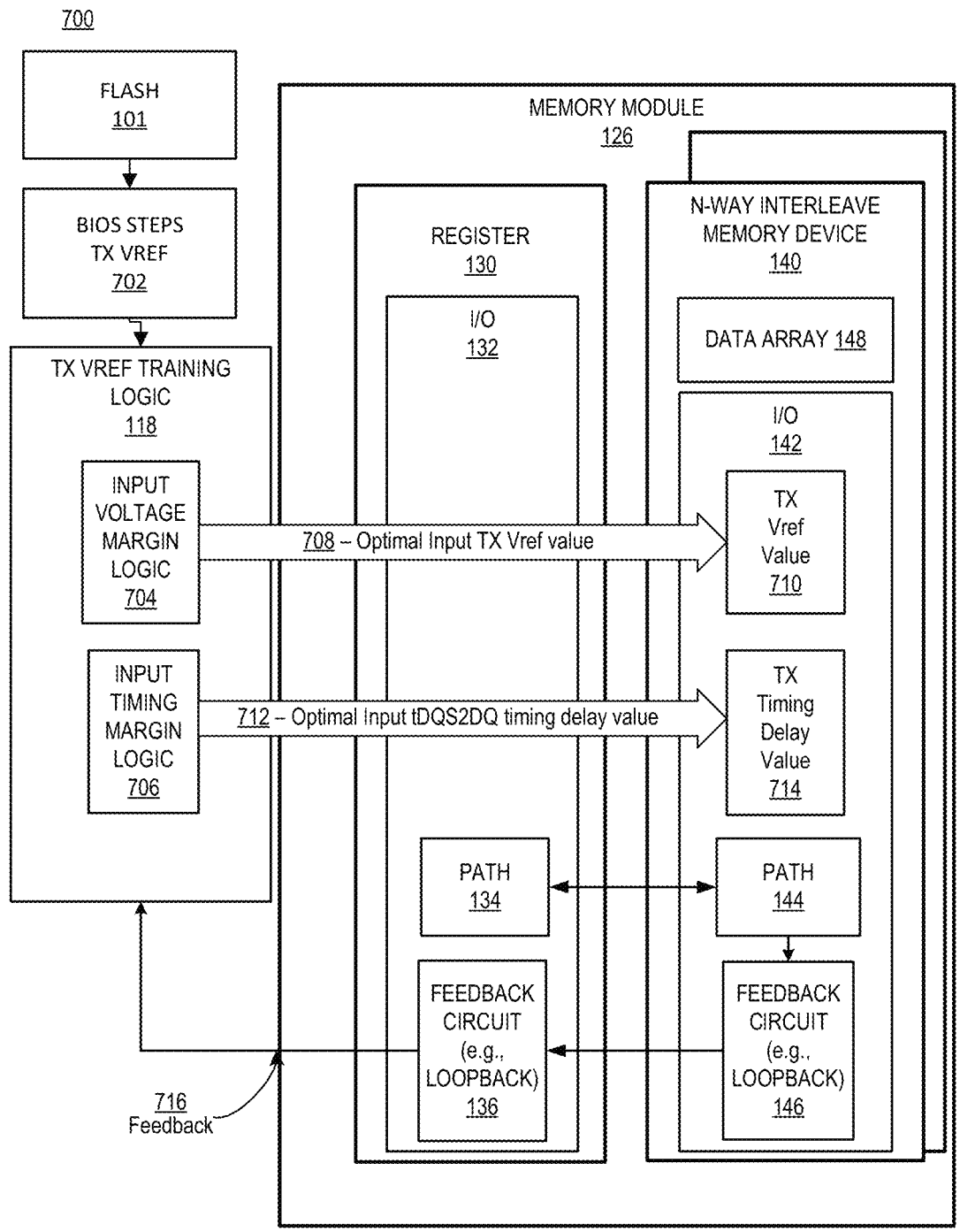
FIG. 7 is a block diagram of an example of a memory subsystem that enables transmitter reference voltage and timing delay training per path for high speed memory signaling in accordance with described embodiments.

FIG. 7 is a block diagram of an example of a memory subsystem 700 that enables transmitter reference voltage (Tx Vref) training and adjustment per path, e.g., path 134, 144, through implementation of Tx Vref training logic 118 based on feedback for a selected path 716. An example of system 700 includes a memory module 120 which includes one or more N-way interleave memory devices 140 and other components as described in FIG. 1, including I/O circuitry 132/142 for a data signal (DQ) and a command/address (CA) signal.

The Tx Vref training logic 118 can include an input voltage margin logic 704 that trains an optimal input Tx Vref value and an optimal input timing delay value, e.g. a tDQS2DQ value. Thus, one output of the training logic 118 includes the trained optimal input Tx Vref value 708 used by the N-way interleave memory device 140 to set the Tx Vref value 710 for a particular data or command/address signal (DQ0, DQ1, ... CA1, CA2). Likewise, another output of the Tx Vref training logic 118 includes the trained optimal input timing delay value 712, e.g., the tDQS2DQ timing delay value, used by N-way interleave memory device 140 to set the Tx timing delay value 714.

Figure 8:
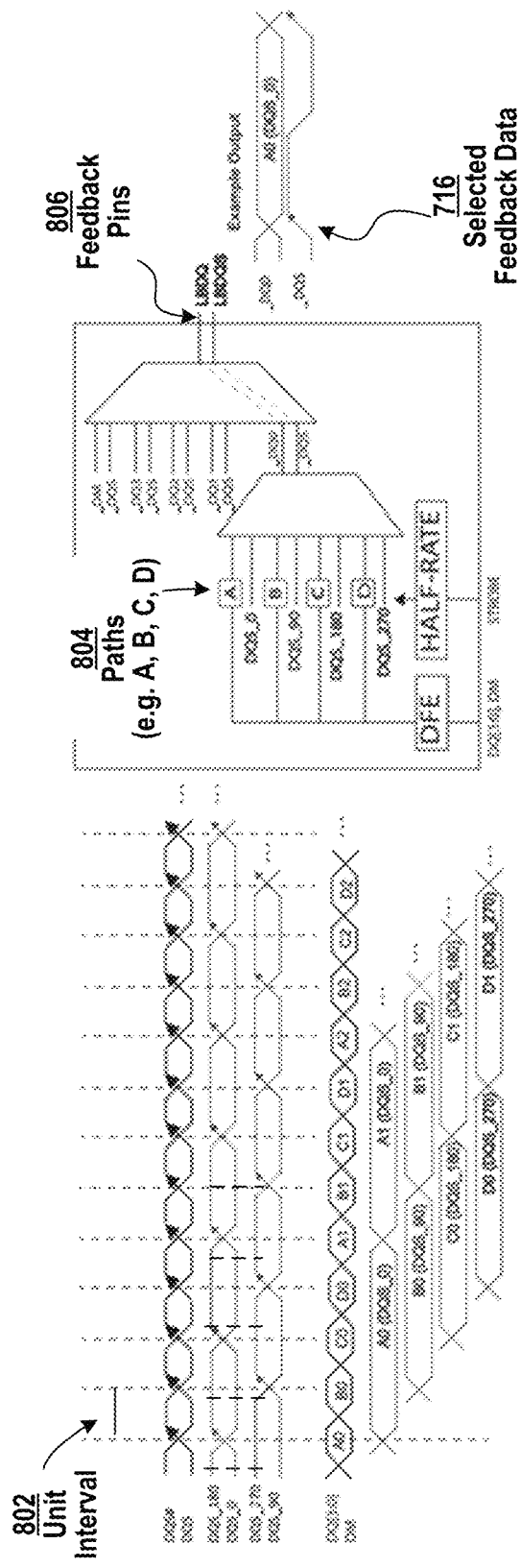
FIG. 8 is a block diagram of an example of a 4-way interleave circuit on a memory device that enables transmitter reference voltage and timing delay training per path for high speed memory signaling in accordance with described embodiments.

FIG. 8 is a block diagram of an example of a 4-way interleave circuit on an X4 DRAM with a decision feedback equalizer (DFE) and a feedback circuit for programming an optimal Tx Vref value and optimal input timing delay for each data signal (e.g., DQ0, DQ1, CA1, CA2). As shown, a data stream can interleave four unit intervals (UIs) 802, each divided into its own data stream destined for a corresponding data path A, B, C or D 804.

To perform the training, a host or test system drives DQS/DQS # and DQ (or CA1, CA2) to the memory device similar to the description of FIG. 3. The input DQ (or CA) data stream from the host/test system to the memory device can be described as a sequence of ABCDABCD data where A is the first UI, B is the second UI, C is the third UI and D is the fourth UI. The N-way interleave memory device can divide the incoming traffic into two or more distinct data paths. On memory devices that implement 2-way interleave the data path is divided into two, i.e., data path A and data path B rather than the four data paths, i.e., data path A, B, C, and D shown in FIG. 8.

A host can proceed with training to find the optimum Tx Vref value using selected feedback per data path 716 provided via feedback pins 806, such as loopback data provided by loopback pins. For example, a host can enable loopback and train for data path A using the loopback data from data path A, train for data path B using the loopback data from data path B, train for data path C using the loopback data from data path C, and lastly train for data path D using the loopback data from data path D.

In one embodiment, selected feedback data 716, such as loopback data, is fed back to the test system and/or memory controller via feedback pins 806. Once training is complete, the trained optimal input Tx Vref value for the data signal is used to program the corresponding Tx Vref value 710. Likewise, the trained optimal input timing delay value is used to program the corresponding Tx timing delay value 714.

Figure 9A:
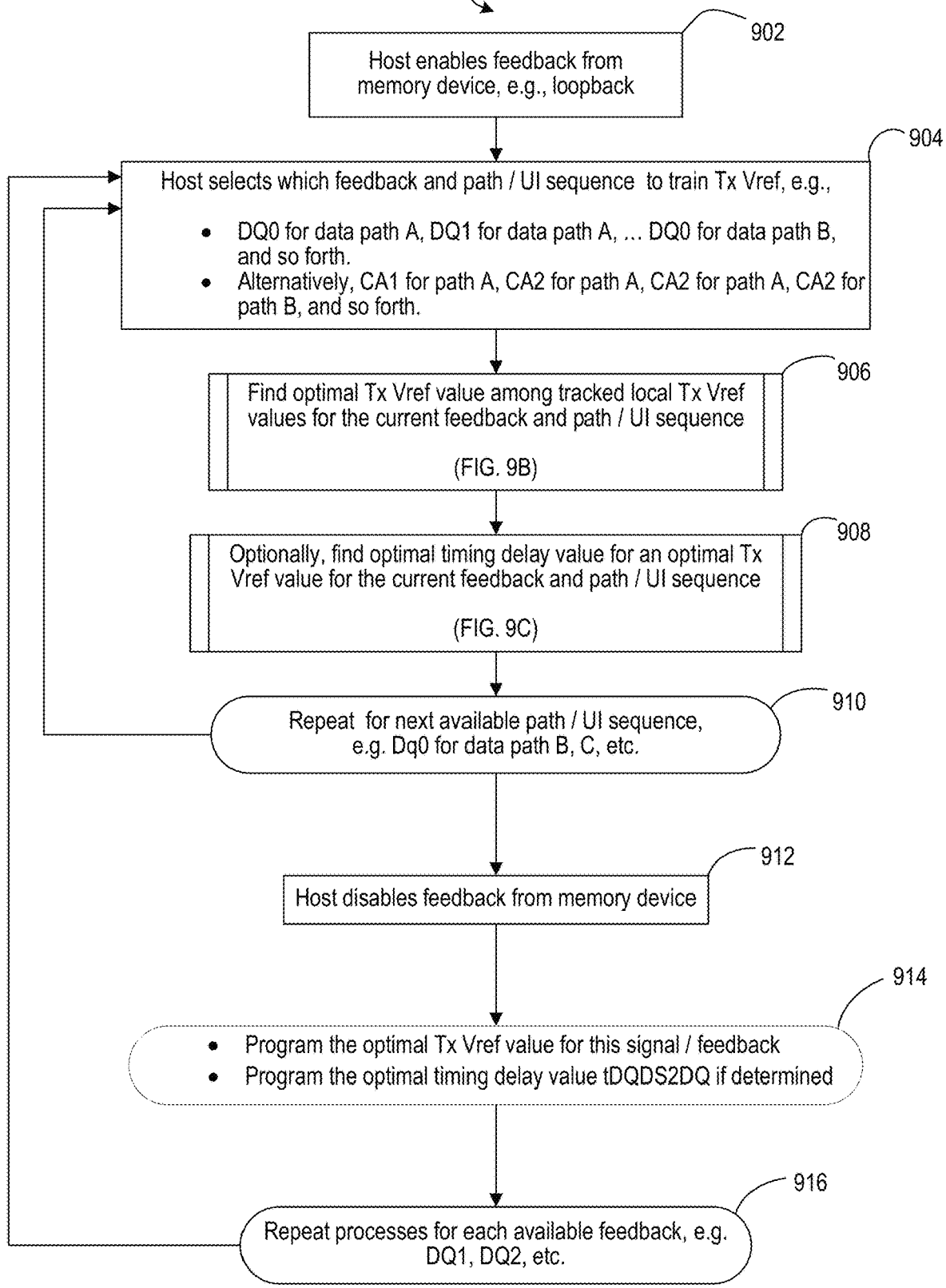
FIGS. 9A-9C are flow diagrams of an example of a process for transmitter reference voltage and timing delay training per path for high speed memory signaling in accordance with described embodiments.
Figure 9B:
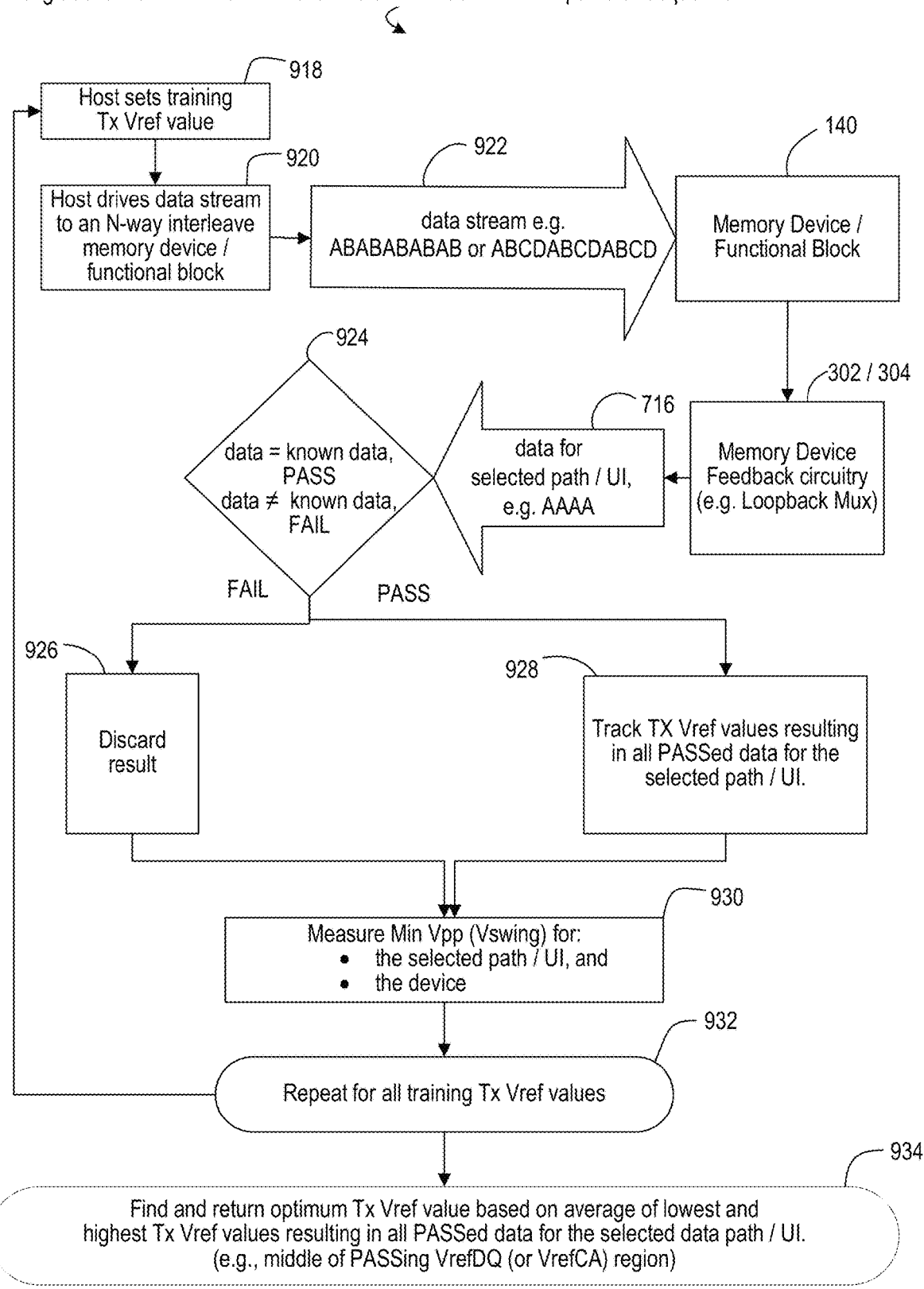
Figure 9C:
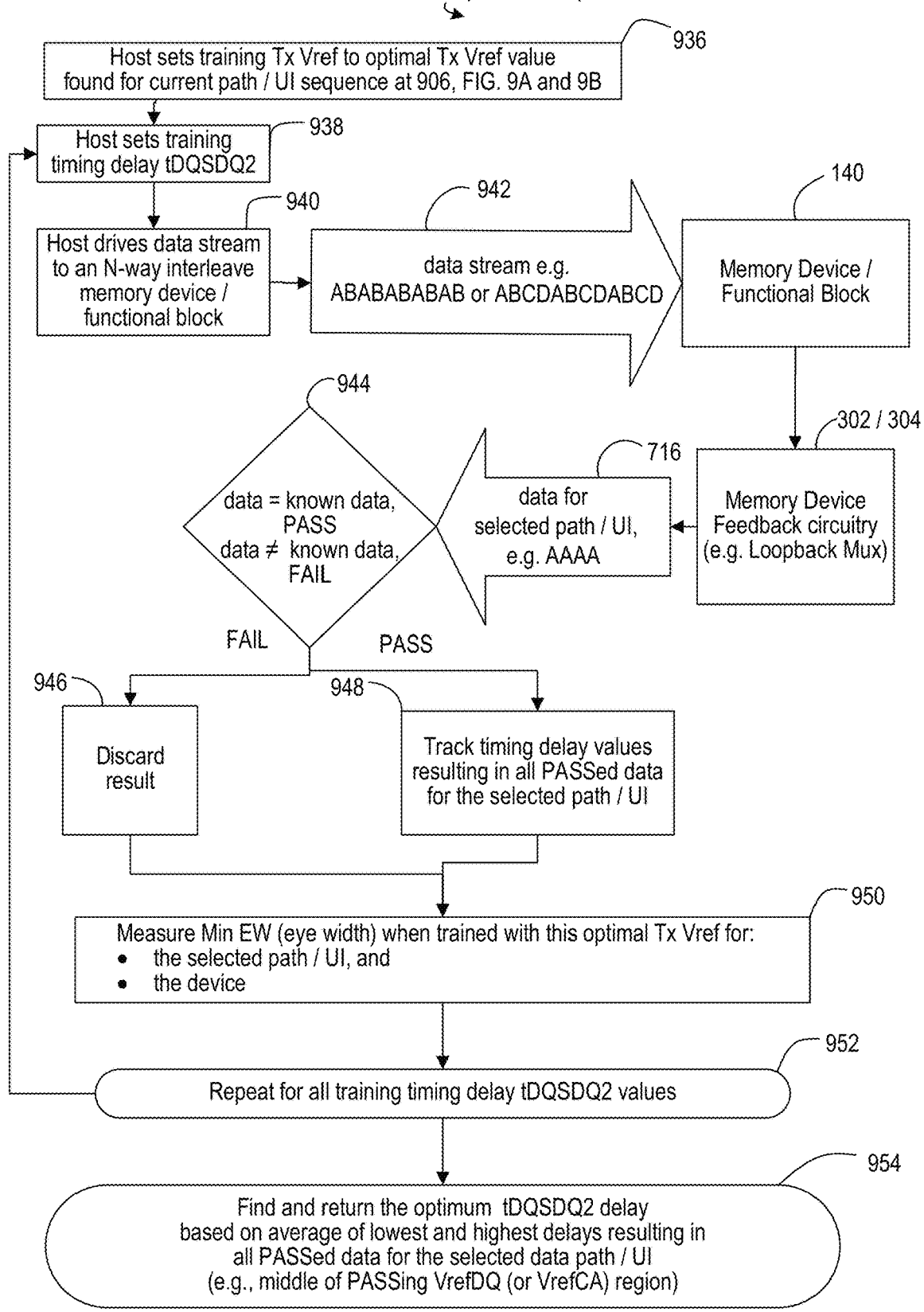

FIGS. 9A-9C are flow diagrams of an example of a process 900 for transmitter reference voltage (Tx Vref) training per path for high speed memory signaling in accordance with described embodiments. In the descriptions that follow it should be understood that references to a host can include a host component of a memory device or a test device. In FIG. 9A, at 902, a host enables feedback from the memory device for which training is to commence. For example, the host component can enable a loopback feature on the memory device.

At 904, the host selects which feedback and path to use to train the corresponding Tx Vrefs. For example, the host can select feedback for data signal DQ0 for data path A, DQ1 for data path A, . . . DQ0 for data path B, and so forth. Alternatively, the host can select feedback for command/address signal CA1 for path A, CA2 for path A, CA1 for path B, CA2 for path B, and so forth. At 906, a process commences to find an optimal Tx Vref among tracked local Tx Vrefs for the selected feedback/path combination, as described in further detail in FIG. 9B. At 908, another process can optionally commence to find an optimal timing delay value for the optimal Tx Vref value found for the current feedback and path/UI sequence at 906, as described in further detail in FIG. 9C.

In one embodiment, at 910 the processes at 906 and 908 are repeated for each of the feedback/path combinations that are selected. At 912, after repeating the processes at 906 and 908 for all available feedback/path combinations, the host disables feedback from the memory device.

In one embodiment, at 914, the host programs the optimal Tx Vref for each data signal and/or command/address signal for which feedback was obtained using the optimal Tx Vrefs per path that were found at 906. In some embodiments, the host selects the optimal Tx Vref from among all of the optimal Tx Vrefs per path that were found at 906, including averaging the optimal Tx Vrefs per path for a given data signal or command/address signal. In one embodiment, the host can also program the optimal timing delay value, e.g., tDQS2DQ, for each programmed optimal Tx Vref. At 916, the host repeats the entire process from 904 to 914 for each available feedback signal, e.g., DQ0, DQ1, DQ2, CA1, CA2, . . . and so forth.

FIG. 9B is a flow diagram of an example process for training the Tx Vref based on selected feedback per path/UI. The host process flow for finding an optimal input Tx Vref value begins at 918 in which the host sets a training Tx Vref value. At 920, the host commences training by driving a data stream 922 to an N-way interleave memory device/functional block 140. After passing through the transmitter and interleave circuitry on the memory device, the memory device feedback circuitry 302/304 provides feedback data 716 for the selected path/UI, e.g., Path A for data stream AAAA. At decision block 924, the returned feedback data 716 is compared to the known data driven in the data stream 922 to determine if the returned data matched the known data (PASSed) or not (FAILed). Training that results is FAILed data is discarded at 926. Training that results in PASSed data is recorded at 928 to track the training Tx Vref values for the selected path/UI that resulted in the PASSed data. At 930, the minimum Vpp (Vswing) for the selected path and the overall device can also be recorded for the training Tx Vref values for the selected path/UI that resulted in the PASSed data. The min Vpp can be used to evaluate the effectiveness of training in accordance with the described embodiments. At 932, the processes beginning at 918 are repeated until all training Tx Vref values have been processed.

In one embodiment, the host processes continue at 934 to find and return an optimum Tx Vref value. For example, the optimum Tx Vref value can be based on an average of lowest and highest Tx Vref values that resulted in PASSed data for the selected data path (e.g., that were in the middle of the PASSing VrefDQ (or VrefCA) region.

An example of voltage margins for memory devices trained using different Tx Vref training values in accordance with Tx Vref training described herein is presented in Table 3.

TABLE 3

|  | Vref | Min Vpp Path A | Min Vpp Path B | Min Vpp For device | Unit |
| --- | --- | --- | --- | --- | --- |
| Vref using Data Path A | 731 | 50 | 90 | 90 | mV |
| Vref using Data Path B | 711 | 35 | 30 | 60 | mV |
| Vref (average) | 718 | 30 | 30 | 30 | mV |

The Min Vpp is the minimum measured Vswing that is being driven by the host to the memory that resulted in all PASS data. If, as shown in Table 1, the Vref value of 731 mv i.e., the Vref value obtained using Path A) then the minimum swing the host must drive is 90 mV. If Vref value of 711 mV (i.e., the Vref value obtained using Path B), then the minimum swing the Host must drive is 60 mV. However, when taking the average, the minimum swing the host must drive becomes 30 mV. Therefore, the memory device is able to tolerate a much lower swing which, in turn, improves voltage margin.

FIG. 9C is a flow diagram of an example process to find an optimal timing delay value for the optimal Tx Vref value for the current feedback and path/UI sequence. At 936 the process commences to set the training Tx Vref value to the optimal Tx Vref value found for the current path/UI sequence. At 938, the host sets a training timing delay value, e.g., tDQSDQ2. At 940, the host commences training by driving a data stream 942 to an N-way interleave memory device/functional block 140. After passing through the transmitter and interleave circuitry on the memory device, the memory device feedback circuitry 302/304 provides feedback data 716 for the selected path/UI, e.g., Path A for data stream AAAA. At decision block 944, the returned feedback data 716 is compared to the known data driven in the data stream 942 to determine if the returned data matched the known data (PASSed) or not (FAILed). Training that results is FAILed data is discarded at 946. Training that results in PASSed data is recorded at 948 to track the training Tx Vref values for the selected path/UI that resulted in the PASSed data. At 950, the minimum data eye width (min EW) for the selected path and the overall device can also be recorded for the training timing delay values for the selected path/UI that resulted in the PASSed data. The minEW can be used to evaluate the effectiveness of training in accordance with the described embodiments. At 952, the processes beginning at 938 are repeated until all training timing delay values have been processed.

In one embodiment, the host processes continue at 934 to find and return an optimum input timing delay value, e.g., tDQSDQ2 value. For example, the optimum Tx Vref value can be based on an average of lowest and highest timing delay values that resulted in PASSed data for the selected data path (e.g., that were in the middle of the PASSing VrefDQ (or VrefCA) region.

An example of the minimum data eye width (EW) for memory devices trained using different Tx Vref training values in accordance with Tx Vref training described herein is presented in Table 4.

TABLE 4

|  | Vref (in mV) | Min EW Path A | Min EW Path B | Min EW Path C | Min EW Path D | Min EW for device | Unit |
| --- | --- | --- | --- | --- | --- | --- | --- |
| Vref using Data Path A | 731 | 179 | 187 | 178 | 178 | 178 | pS |
| Vref using Data Path B | 711 | 187 | 186 | 190 | 190 | 187 | pS |
| Vref using Data Path C | 714 | 187 | 186 | 190 | 190 | 187 | pS |
| Vref using Data Path D | 714 | 187 | 186 | 190 | 190 | 187 | pS |
| Vref (average all paths) | 718 | 186 | 187 | 190 | 190 | 186 | pS |

As shown in Table 4, when trained using Vref from Path A the min EW is 178 pS. When trained using Vref from Path B, C or D, however, the average min EW is 187 pS. Lastly, when trained using the average Vref from all paths A, B, C and D the min EW is 186 pS. In this example, the Tx Vref training described herein can select Tx Vref training values from Path B, C, D, i.e., 711 mV or 714 mV, to help improve timing margin.

It should be noted that with reference to the processes described in flow diagrams FIGS. 9A-9C that all processes can be implemented for training transmitter reference voltages not just in DRAM but also in data buffers, register clock drivers (RCDs) and other functional blocks of a memory device.

Figure 10:
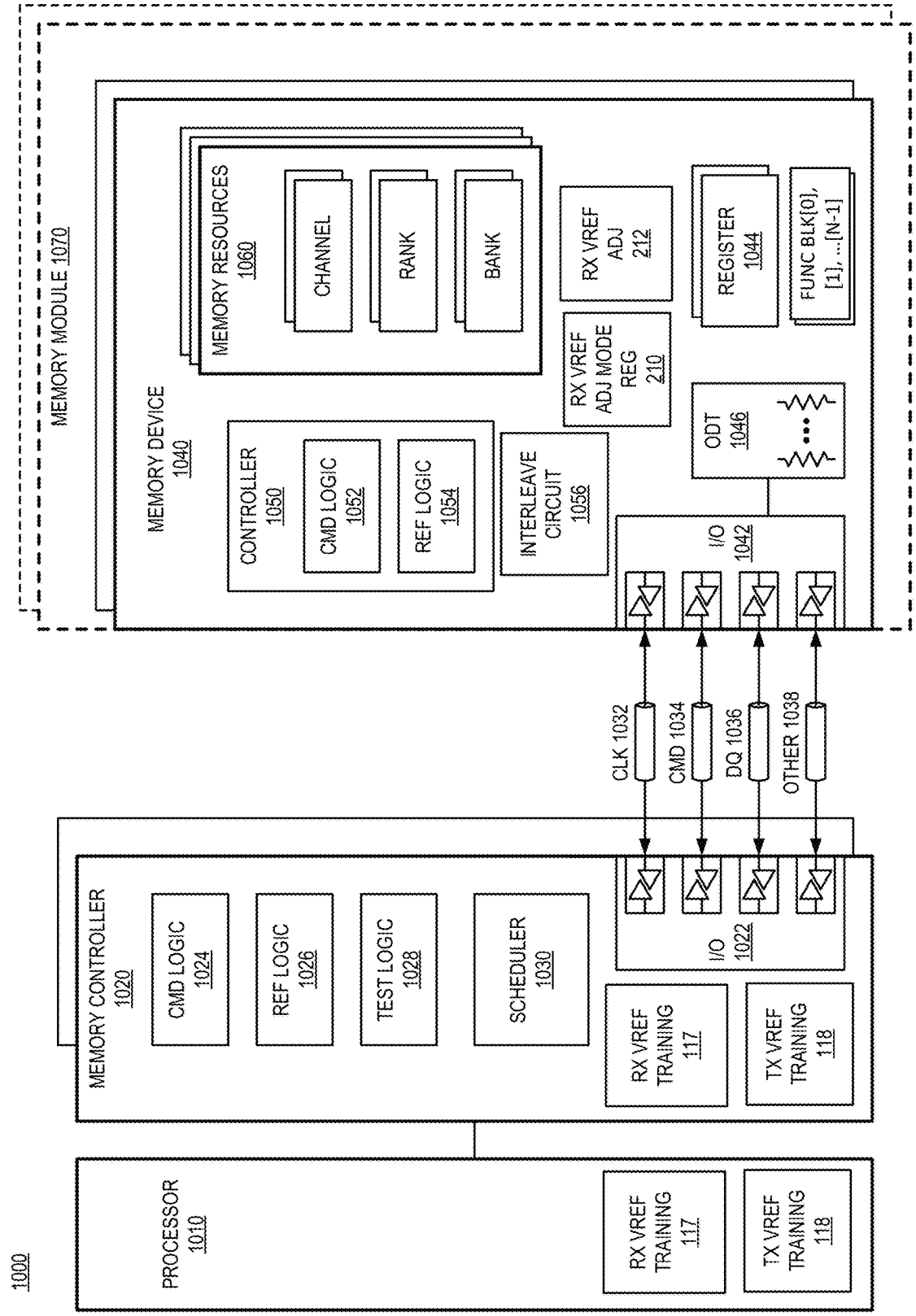
FIG. 10 is a block diagram of an example of a memory subsystem with a memory device in which described embodiments can be implemented.

FIG. 10 is a block diagram of an example of a memory subsystem including a memory device in which reference voltage training and adjustment in accordance with the described embodiments can be implemented. System 1000 includes a processor and elements of a memory subsystem in a computing device. Processor 1010 represents a processing unit of a computing platform that may execute an operating system (OS) and applications, which can collectively be referred to as the host or the user of the memory. The OS and applications execute operations that result in memory accesses. Processor 1010 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 1000 can be implemented as an SOC (system on a chip), or be implemented with standalone components. Processor 1010 can perform reference voltage and adjustment training logic, such as Rx Vref training logic 117 and Tx Vref training logic 118.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM).

As is known in the art, the Joint Electron Device Engineering Council (JEDEC), promulgates memory channel interface specifications for adaptation by computer and other electronic equipment manufacturers. JEDEC emphasizes a memory access technique, referred to as a dual data rate (DDR) in which data transfers are entertained on both the rising and falling edges of a transfer clock. The accepted nomenclature for JEDEC specifications is to number them in order as they are released (e.g., DDR3, DDR4, DDR5, etc.). The most recent JEDEC DDR specifications correspond to DDR4 and DDR5. A memory subsystem as described herein may be compatible with a number of memory technologies, including DDR5 and others, or combinations of memory technologies, and technologies based on derivatives or extensions of such specifications. The JEDEC standards are available at www.jedec.org.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 1020 represents one or more memory controller circuits or devices for system 1000. Memory controller 1020 represents control logic that generates memory access commands in response to the execution of operations by processor 1010. Memory controller 1020 accesses one or more memory devices 1040. Memory devices 1040 can be DRAM devices in accordance with any referred to above. In one example, memory devices 1040 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 1020 manages a separate memory channel, although system 1000 can be configured to have multiple channels managed by a single controller, or to have multiple controllers on a single channel. In one example, memory controller 1020 is part of host processor 1010, such as logic implemented on the same die or implemented in the same package space as the processor.

Memory controller 1020 includes I/O interface logic 1022 to couple to a memory bus, such as a memory channel as referred to above. I/O interface logic 1022 (as well as I/O interface logic 1042 of memory device 1040) can include pins, pads, connectors, signal lines, traces, or wires, or other hardware to connect the devices, or a combination of these. I/O interface logic 1022 can include a hardware interface. As illustrated, I/O interface logic 1022 includes at least drivers/transceivers for signal lines. Commonly, wires within an integrated circuit interface couple with a pad, pin, or connector to interface signal lines or traces or other wires between devices. I/O interface logic 1022 can include drivers, receivers, transceivers, or termination, or other circuitry or combinations of circuitry to exchange signals on the signal lines between the devices. The exchange of signals includes at least one of transmit or receive. While shown as coupling I/O 1022 from memory controller 1020 to I/O 1042 of memory device 1040, it will be understood that in an implementation of system 1000 where groups of memory devices 1040 are accessed in parallel, multiple memory devices can include I/O interfaces to the same interface of memory controller 1020. In an implementation of system 1000 including one or more memory modules 1070, I/O 1042 can include interface hardware of the memory module in addition to interface hardware on the memory device itself. Other memory controllers 1020 will include separate interfaces to other memory devices 1040.

The bus between memory controller 1020 and memory devices 1040 can be implemented as multiple signal lines coupling memory controller 1020 to memory devices 1040. The bus may typically include at least clock (CLK) 1032, command/address (CMD) 1034, and write data (DQ) and read data (DQ) 1036, and zero or more other signal lines 1038. In one example, a bus or connection between memory controller 1020 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 1000 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 1020 and memory devices 1040. An example of a serial bus technology is 8B10B encoding and transmission of high-speed data with embedded clock over a single differential pair of signals in each direction. In one example, CMD 1034 represents signal lines shared in parallel with multiple memory devices. In one example, multiple memory devices share encoding command signal lines of CMD 1034, and each has a separate chip select (CS_n) signal line to select individual memory devices.

It will be understood that in the example of system 1000, the bus between memory controller 1020 and memory devices 1040 includes a subsidiary command bus CMD 1034 and a subsidiary bus to carry the write and read data, DQ 1036. In one example, the data bus can include bidirectional lines for read data and for write/command data. In another example, the subsidiary bus DQ 1036 can include unidirectional write signal lines for write and data from the host to memory, and can include unidirectional lines for read data from the memory to the host. In accordance with the chosen memory technology and system design, other signals 1038 may accompany a bus or sub bus, such as strobe lines DQS. Based on design of system 1000, or implementation if a design supports multiple implementations, the data bus can have more or less bandwidth per memory device 1040. For example, the data bus can support memory devices that have either a x32 interface, a x16 interface, a x8 interface, or other interface. The convention "xW," where W is an integer that refers to an interface size or width of the interface of memory device 1040, which represents a number of signal lines to exchange data with memory controller 1020. The interface size of the memory devices is a controlling factor on how many memory devices can be used concurrently per channel in system 1000 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 1040 and memory controller 1020 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 1040 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 1040 represent memory resources for system 1000. In one example, each memory device 1040 is a separate memory die. In one example, each memory device 1040 can interface with multiple (e.g., 2) channels per device or die. Each memory device 1040 includes I/O interface logic 1042, which has a bandwidth determined by the implementation of the device (e.g., x16 or x8 or some other interface bandwidth). I/O interface logic 1042 enables the memory devices to interface with memory controller 1020. I/O interface logic 1042 can include a hardware interface, and can be in accordance with I/O 1022 of memory controller, but at the memory device end. In one example, multiple memory devices 1040 are connected in parallel to the same command and data buses. In another example, multiple memory devices 1040 are connected in parallel to the same command bus, and are connected to different data buses. For example, system 1000 can be configured with multiple memory devices 1040 coupled in parallel, with each memory device responding to a command, and accessing memory resources 1060 internal to each. For a Write operation, an individual memory device 1040 can write a portion of the overall data word, and for a Read operation, an individual memory device 1040 can fetch a portion of the overall data word. As non-limiting examples, a specific memory device can provide or receive, respectively, 8 bits of a 1228-bit data word for a Read or Write transaction, or 8 bits or 126 bits (depending for a x8 or a x16 device) of a 256-bit data word. The remaining bits of the word will be provided or received by other memory devices in parallel.

In one example, memory devices 1040 are disposed directly on a motherboard or host system platform (e.g., a PCB (printed circuit board) on which processor 1010 is disposed) of a computing device. In one example, memory devices 1040 can be organized into memory modules 1070. In one example, memory modules 1070 represent dual inline memory modules (DIMMs). In one example, memory modules 1070 represent other organization of multiple memory devices to share at least a portion of access or control circuitry, which can be a separate circuit, a separate device, or a separate board from the host system platform. Memory modules 1070 can include multiple memory devices 1040, and the memory modules can include support for multiple separate channels to the included memory devices disposed on them. In another example, memory devices 1040 may be incorporated into the same package as memory controller 1020, such as by techniques such as multi-chip-module (MCM), package-on-package, through-silicon via (TSV), or other techniques or combinations. Similarly, in one example, multiple memory devices 1040 may be incorporated into memory modules 1070, which themselves may be incorporated into the same package as memory controller 1020. It will be appreciated that for these and other implementations, memory controller 1020 may be part of host processor 1010.

Memory devices 1040 each include memory resources 1060. Memory resources 1060 represent individual arrays of memory locations or storage locations for data. Typically memory resources 1060 are managed as rows of data, accessed via wordline (rows) and bitline (individual bits within a row) control. Memory resources 1060 can be organized as separate channels, ranks, and banks of memory. Channels may refer to independent control paths to storage locations within memory devices 1040. Ranks may refer to common locations across multiple memory devices (e.g., same row addresses within different devices). Banks may refer to arrays of memory locations within a memory device 1040. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 1040 include one or more registers 1044. Register 1044 represents one or more storage devices or storage locations that provide configuration or settings for the operation of the memory device. In one example, register 1044 can provide a storage location for memory device 1040 to store data for access by memory controller 1020 as part of a control or management operation. In one example, register 1044 includes one or more Mode Registers. In one example, register 1044 includes one or more multipurpose registers. In one example, memory devices 1040 include dedicated mode registers, such as the Rx Vref Adjuster mode registers 210 that trigger operation of the Rx Vref Adjuster circuit 212. The configuration of locations within register 1044 can configure memory device 1040 to operate in different "modes," where command information can trigger different operations within memory device 1040 based on the mode. Additionally or in the alternative, different modes can also trigger different operation from address information or other signal lines depending on the mode. Settings of register 1044 can indicate configuration for I/O settings (e.g., timing, termination or ODT (on-die termination) 1046, driver configuration, or other I/O settings).

In one example, memory device 1040 includes ODT 1046 as part of the interface hardware associated with I/O 1042. ODT 1046 can be configured as mentioned above, and provide settings for impedance to be applied to the interface to specified signal lines. In one example, ODT 1046 is applied to DQ signal lines. In one example, ODT 1046 is applied to command signal lines. In one example, ODT 1046 is applied to address signal lines. In one example, ODT 1046 can be applied to any combination of the preceding. The ODT settings can be changed based on whether a memory device is a selected target of an access operation or a non-target device. ODT 1046 settings can affect the timing and reflections of signaling on the terminated lines. Careful control over ODT 1046 can enable higher-speed operation with improved matching of applied impedance and loading. ODT 1046 can be applied to specific signal lines of I/O interface 1042, 1022, and is not necessarily applied to all signal lines.

Memory device 1040 can also include an interleave circuit 1056 for dividing a data stream in a signal line into different data paths.

Memory device 1040 includes controller 1050, which represents control logic within the memory device to control internal operations within the memory device. For example, controller 1050 decodes commands sent by memory controller 1020 and generates internal operations to execute or satisfy the commands. Controller 1050 can be referred to as an internal controller, and is separate from memory controller 1020 of the host. Controller 1050 can determine what mode is selected based on register 1044, and configure the internal execution of operations for access to memory resources 1060 or other operations based on the selected mode. Controller 1050 generates control signals to control the routing of bits within memory device 1040 to provide a proper interface for the selected mode and direct a command to the proper memory locations or addresses. Controller 1050 includes command logic 1052, which can decode command encoding received on command and address signal lines. Thus, command logic 1052 can be or include a command decoder. With command logic 1052, memory device can identify commands and generate internal operations to execute requested commands.

Referring again to memory controller 1020, memory controller 1020 includes command (CMD) logic 1024, which represents logic or circuitry to generate commands to send to memory devices 1040. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 1040, memory controller 1020 can issue commands via I/O 1022 to cause memory device 1040 to execute the commands. In one example, controller 1050 of memory device 1040 receives and decodes command and address information received via I/O 1042 from memory controller 1020. Based on the received command and address information, controller 1050 can control the timing of operations of the logic and circuitry within memory device 1040 to execute the commands. Controller 1050 is responsible for compliance with standards or specifications within memory device 1040, such as timing and signaling requirements. Memory controller 1020 can implement compliance with standards or specifications by access scheduling and control.

Memory controller 1020 includes scheduler 1030, which represents logic or circuitry to generate and order transactions to send to memory device 1040. From one perspective, the primary function of memory controller 1020 could be said to schedule memory access and other transactions to memory device 1040. Such scheduling can include generating the transactions themselves to implement the requests for data by processor 1010 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 1020 typically includes logic such as scheduler 1030 to allow selection and ordering of transactions to improve performance of system 1000. Thus, memory controller 1020 can select which of the outstanding transactions should be sent to memory device 1040 in which order, which is typically achieved with logic much more complex that a simple first-in first-out algorithm. Memory controller 1020 manages the transmission of the transactions to memory device 1040, and manages the timing associated with the transaction. In one example, transactions have deterministic timing, which can be managed by memory controller 1020 and used in determining how to schedule the transactions with scheduler 1030.

In one example, memory controller 1020 includes refresh (REF) logic 1026. Refresh logic 1026 can be used for memory resources that are volatile and need to be refreshed to retain a deterministic state. In one example, refresh logic 1026 indicates a location for refresh, and a type of refresh to perform. Refresh logic 1026 can trigger self-refresh within memory device 1040, or execute external refreshes which can be referred to as auto refresh commands) by sending refresh commands, or a combination. In one example, system 1000 supports all bank refreshes as well as per bank refreshes. All bank refreshes cause the refreshing of banks within all memory devices 1040 coupled in parallel. Per bank refreshes cause the refreshing of a specified bank within a specified memory device 1040. In one example, controller 1050 within memory device 1040 includes refresh logic 1054 to apply refresh within memory device 1040. In one example, refresh logic 1054 generates internal operations to perform refresh in accordance with an external refresh received from memory controller 1020. Refresh logic 1054 can determine if a refresh is directed to memory device 1040, and what memory resources 1060 to refresh in response to the command.

In one example, memory controller 1020 includes test logic 1028, which represents logic in the memory controller to train I/O in system 1000. Namely, test logic 1028 provides sequences of transactions to memory device 1040 to enable memory device 1040 to test receiving signals at I/O 1042 in accordance with different settings. I/O 1042 can be operated in accordance with various settings, which can be set with registers local to I/O 1042, or with mode registers, or with a combination of mode registers and local registers. In one example, the test logic 1028 includes the reference voltage training and adjustment logic 116 as described herein, include Rx Vref training logic 117 and Tx Vref training logic 118. The test logic 1028 can include sequences of transactions with settings for different phase settings for the signaling, which can include voltage settings, current settings, termination settings, phase compensation (e.g., delay locked loops) settings, or other settings, or a combination of multiple different types of settings. The transactions can allow the iteration of I/O with different settings or combinations of settings to find settings that can meet an expected bit error rate (BER).

Figure 11:
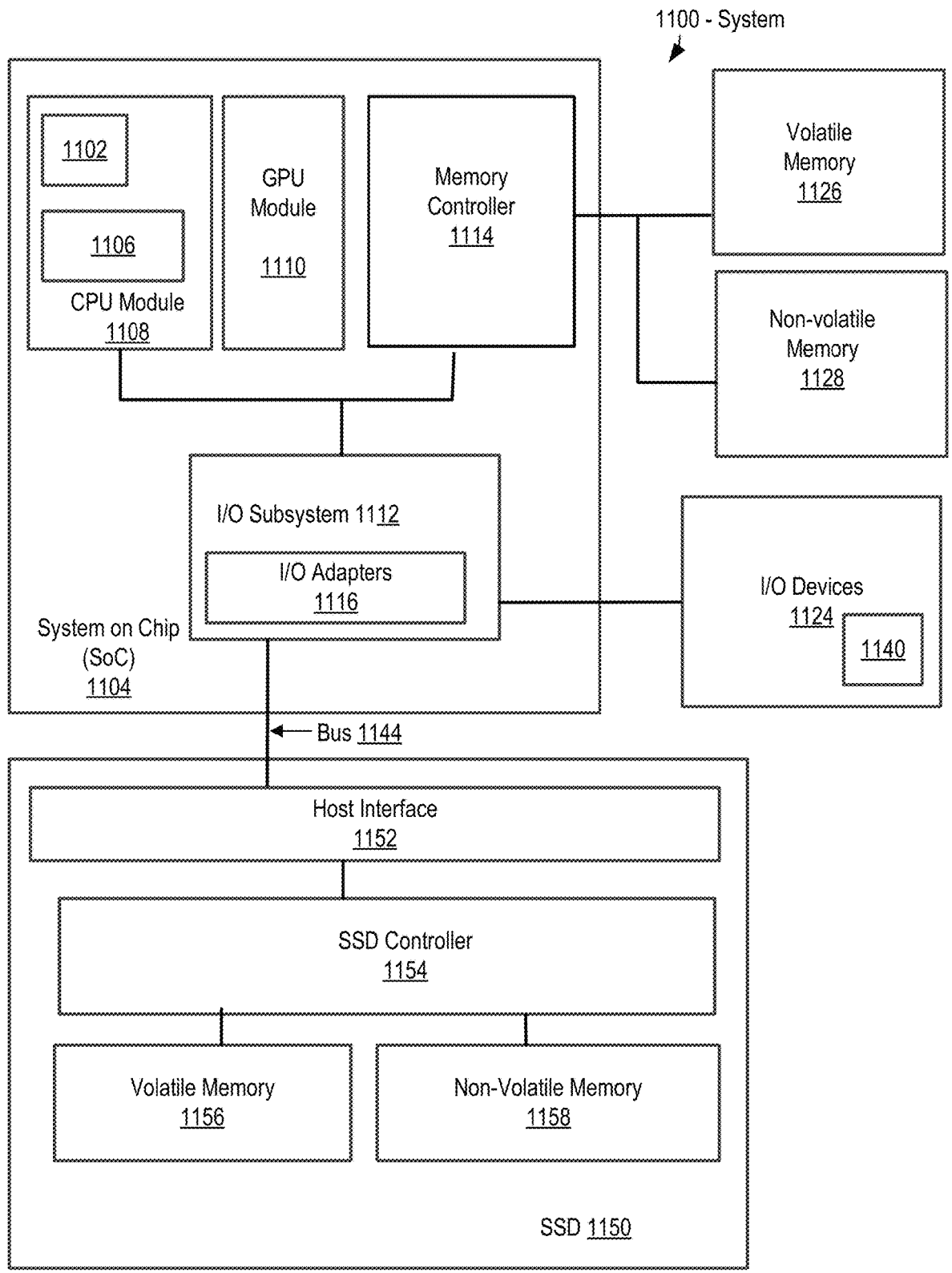
FIG. 11 is a block diagram of an example of a computing system in which described embodiments can be implemented.

FIG. 11 is a block diagram of an embodiment of a computer system 1100 that includes a memory controller 1114 to control volatile memory 1126 and non-volatile memory 1128. Computer system 1100 can correspond to a computing device including, but not limited to, a server, a workstation computer, a desktop computer, a laptop computer, and/or a tablet computer.

The computer system 1100 includes a system on chip (SoC) 1104 which combines processor, graphics, memory, and Input/Output (I/O) control logic into one SoC package. The SoC 1104 includes at least one Central Processing Unit (CPU) module 1108, the memory controller 1114, and a Graphics Processor Unit (GPU) 1110. In other embodiments, the memory controller 1114 can be external to the SoC 1104. The CPU module 1108 includes at least one processor core 1102, and a level 2 (L2) cache 1106.

Although not shown, each of the processor core(s) 1102 can internally include one or more instruction/data caches, execution units, prefetch buffers, instruction queues, branch address calculation units, instruction decoders, floating point units, retirement units, etc. The CPU module 1108 can correspond to a single core or a multi-core general purpose processor, such as those provided by Intel® Corporation, according to one embodiment.

The Graphics Processor Unit (GPU) 1110 can include one or more GPU cores and a GPU cache which can store graphics related data for the GPU core. The GPU core can internally include one or more execution units and one or more instruction and data caches. Additionally, the Graphics Processor Unit (GPU) 1110 can contain other graphics logic units that are not shown in FIG. 11, such as one or more vertex processing units, rasterization units, media processing units, and codecs.

Within the I/O subsystem 1112, one or more I/O adapter (s) 1116 are present to translate a host communication protocol utilized within the processor core(s) 1102 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 1116 can communicate with external I/O devices 1124 which can include, for example, user interface device(s) including a display and/or a touch-screen display 1140, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The I/O adapter(s) 1116 can also communicate with a solid-state drive ("SSD") 1150 which includes an SSD controller 1154, a host interface 1152, a volatile memory 1156 and a non-volatile memory (NVM) device 1158 that includes one or more NVM arrays and NVM controllers.

An NVM device 1158 is a memory whose state is determinate even if power is interrupted to the device. In one embodiment, the NVM device 1158 that includes the one or more NVM arrays and NVM controllers can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), and Penta-Level Cell ("PLC") or some other NAND).

The I/O adapters 1116 can include a Peripheral Component Interconnect Express (PCIe) adapter that is communicatively coupled using the NVMe (NVM Express) over PCIe (Peripheral Component Interconnect Express) protocol over bus 1144 to a host interface 1152 in the SSD 1150/200. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org. The PCIe standards are available at www.pcisig.com.

Volatile memory 1156 is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein can be compatible with a number of memory technologies described with reference to FIG. 10, such as DDR5 or others or combinations of memory technologies, and technologies based on derivatives or extensions of such specifications.

An operating system is software that manages computer hardware and software including memory allocation and access to I/O devices. Examples of operating systems include Microsoft® Windows®, Linux®, iOS® and Android®.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, NAND flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Additional example implementations are as follows:

Example 1 is any of a method, system, apparatus or computer-readable medium comprising circuitry to adjust a local receiver reference voltage (local Rx Vref) for a path of a data stream received in a memory device, the circuitry to adjust the local Rx Vref to an optimal local Rx Vref for the path based on a global Rx Vref for all paths of the data stream and an adjustment value stored in a mode register for the path, and wherein the global Rx Vref was previously determined based on a training feedback for local Rx Vrefs in all paths of the data stream, and the optimal local Rx Vref for the path was previously determined based on the training feedback for local Rx Vrefs in the path.

Example 2 is any of the method, system, apparatus or computer-readable medium of Example 1, wherein the adjustment value was previously determined based on the global Rx Vref for all paths and the optimal local Rx Vref for the path, the adjustment value to compensate for a difference between the global Rx Vref and the optimal local Rx Vref for the path.

Example 3 is any of the method, system, apparatus or computer-readable medium of Examples 1 and 2, in which the optimal local Rx Vref previously determined during training is based on an average of the local Rx Vrefs in the path, the average representing a midpoint of a range of the local Rx Vrefs for which a positive training feedback was received, wherein the positive training feedback matched known data for the path into which the data streams for the local Rx Vrefs were divided.

Example 4 is any of the method, system, apparatus or computer-readable medium of Examples 1 through 3, wherein the training feedback includes results from a functional block of the memory device for the path into which the data stream was divided, the functional block including any of a dynamic random access memory (DRAM), a register clock driver ("RCD") and a data buffer, and the positive training feedback includes the training feedback matching expected results from the functional block of the memory device, the expected results including known data for the path into which the data stream was divided during training.

Example 5 is any of the method, system, apparatus or computer-readable medium of Examples 1 through 4, wherein the global Rx Vref for all paths of the data stream was previously determined based on any of an average of the optimal local Rx Vrefs per path and a selected one of the optimal local Rx Vrefs per path.

Example 6 is any of the method, system, apparatus or computer-readable medium of Examples 1 through 5, further comprising a mode register in which to store the adjustment value, including one or more adjustment steps of a predetermined size and a sign bit, and in which the circuitry to adjust the local Rx Vref to the optimal local Rx Vref includes circuitry to access the mode register to obtain the one or more adjustment steps of the predetermined size and the sign bit, and any of add to or subtract from the global Rx Vref, based on the sign bit, the one or more adjustment steps of the predetermined size until reaching the optimal local Rx Vref for the path.

Example 7 is any of the method, system, apparatus or computer-readable medium of Examples 1 through 6, further comprising a loopback circuitry in which the training feedback was generated.

Example 8 is any of the method, system, apparatus or computer-readable medium of Examples 1 through 7, further comprising an input/output (I/O) interface to divide the data stream into two or more paths through the memory device, including an interleave circuitry capable of dividing an interleaved data stream into N paths, each path corresponding to a unit interval (UI) of the interleaved data stream, and wherein the data stream includes any of a data signal (DQ) and a command/address (CA) signal streamed to the memory device.

Example 9 is any of the method, system, apparatus or computer-readable medium of Examples 1 through 8, further comprising a memory module in which the memory device is contained, the memory module including a Dual Inline Memory Module (DIMM).

Although the foregoing detailed description referenced illustrative embodiments of the claimed subject matter, many alternatives, modifications, and variations thereof will be apparent to those skilled in the art. Accordingly, it is intended that the claimed subject matter be viewed broadly and defined as set forth in the accompanying claims.

What is claimed is:

1. A memory device comprising:
   an input/output (I/O) interface to divide a data stream into two or more paths through a memory device;
   a mode register to store adjustment values programmed by a host of the memory device using a training feedback for local receiver reference voltages (local Rx Vrefs) per each of the two or more paths through the memory device, the training feedback including retrieval of data from the memory device;
   a global Rx Vref value for all paths through the memory device, programmed by the host of the memory device using the training feedback for the local Rx Vrefs; and
   circuitry to adjust a local receiver reference voltage (local Rx Vref) for a path of a data stream received in the memory device, including to:
   obtain the global Rx Vref value for all paths,
   access the mode register to obtain an adjustment value for the path of the data stream received in the memory device,
   adjust the global Rx Vref value for all paths using the adjustment value to obtain an adjusted local Rx Vref for the path, wherein the adjusted local Rx Vref is to ensure a least number of errors in the data stream received in the memory device.

2. The memory device of claim 1, wherein the adjustment values were previously programmed by the host using the global Rx Vref value for all paths and adjusted local Rx Vrefs per each of the two or more paths through the memory device found to ensure a least number of errors in data exchanged between the host and the memory device, the adjustment values to compensate for a difference between the global Rx Vref and the adjusted local Rx Vref value for the path.

3. The memory device of claim 1, the adjustment values programmed by the host using the training feedback is an average of adjusted local Rx Vrefs the circuitry determined for all paths, the average representing a midpoint of a range of the local Rx Vrefs per path for which a positive training feedback was received, wherein the positive training feedback matched known data for each path into which data streams for the local Rx Vrefs were divided.

4. The memory device of claim 3, wherein:
   the training feedback includes results from a functional block of the memory device for the path into which the data stream was divided, the functional block including any of a dynamic random access memory (DRAM), a register clock driver ("RCD") and a data buffer; and
   the positive training feedback includes the training feedback matching expected results from the functional block of the memory device, the expected results including known data for the path into which the data stream was divided during training.

5. The memory device of claim 3, wherein the global Rx Vref value for all paths of the data stream was programmed by the host using any of the average of the adjusted local Rx Vrefs per path and a selected one of the adjusted local Rx Vrefs per path.

6. The memory device of claim 2, wherein:
   the mode register to store the adjustment values includes one or more adjustment steps of a predetermined size and a sign bit; and
   the circuitry to adjust the local Rx Vref includes circuitry to:
   access the mode register to obtain the one or more adjustment steps of the predetermined size and the sign bit, and
   any of add to or subtract from the global Rx Vref value, based on the sign bit, the one or more adjustment steps of the predetermined size until reaching the adjusted local Rx Vref for the path found to ensure the least number of errors in the data stream received in the memory device.

7. The memory device of claim 1, further comprising a loopback circuitry in which the training feedback was generated without having access to data retrieved from the memory device.

8. The memory device of claim 1, wherein:
   the I/O interface to divide the data stream into two or more paths through the memory device, including an interleave circuitry capable of dividing an interleaved data stream into N paths, each path corresponding to a unit interval (UI) of the interleaved data stream; and
   wherein the data stream including any of a data signal (DQ) and a command/address (CA) signal streamed to the memory device.

9. The memory device of claim 1, further comprising a memory module in which the memory device is contained, the memory module including a Dual Inline Memory Module (DIMM).

10. A method comprising:
in a circuit of a memory device, adjusting a local receiver reference voltage (local Rx Vref) for a path through the memory device, including:
accessing a global Rx Vref for all paths through the memory device, the global Rx Vref having been previously programmed by a host of the memory device using a training feedback for local Rx Vrefs per each of two or more paths through the memory device, the training feedback including retrieval of data from the memory device,
accessing adjustment values having been previously programmed by the host of the memory device using the training feedback for the local Rx Vrefs per each of the two or more paths through the memory device;
receiving a data stream for the path, the data stream having been divided into two or more paths; and
adjusting the global Rx Vref for all paths using an adjustment value to obtain an adjusted local Rx Vref for the path, wherein the adjusted local Rx Vref for the path is to ensure a least number of errors in the data stream received in the memory device.

11. The method of claim 10, wherein the adjustment values were previously programmed by the host using the global Rx Vref for all paths and adjusted local Rx Vrefs per each of the two or more paths through the memory device found to ensure a least number of errors in data exchanged between the host and the memory device, the adjustment values to compensate for a difference between the global Rx Vref and the adjusted local Rx Vref for the path.

12. The method of claim 11, the adjustment values programmed by the host using the training feedback is an average of the adjusted local Rx Vrefs the circuit determined for all paths, the average representing a midpoint of a range of the local Rx Vrefs per path for which a positive training feedback was received, wherein the positive training feedback matched known data for each path into which data streams for the local Rx Vrefs were divided.

13. The method of claim 12, wherein:
the training feedback includes results from a functional block of the memory device for the path into which the data stream was divided, the functional block including any of a dynamic random access memory (DRAM), a register clock driver ("RCD") and a data buffer; and
the positive training feedback includes the training feedback matching expected results from the functional block of the memory device, the expected results including known data for the path into which the data stream was divided during training.

14. The method of claim 13, wherein the global Rx Vref for all paths of the data stream was programmed by the host using any of the average of the adjusted local Rx Vrefs per path and a selected one of the adjusted local Rx Vrefs per path.

15. The method of claim 10, wherein:
the adjustment values includes one or more adjustment steps of a predetermined size and a sign bit; and
adjusting the local Rx Vref includes:
accessing the one or more adjustment steps of the predetermined size and the sign bit, and
any of adding to or subtracting from the global Rx Vref, based on the sign bit, the one or more adjustment steps of the predetermined size until reaching the adjusted local Rx Vref for the path found to ensure the least number of errors in the data stream received in the memory device.

16. The method of claim 10, wherein the adjusted local Rx Vref for the path results in a performance characteristic indicating an improved voltage margin.

17. The method of claim 10, wherein any of:
the training feedback is generated in a loopback circuitry of the memory device, without having access to data retrieved from the memory device;
the memory device is an N-way interleave memory device including an interleave circuit capable of dividing an interleaved data stream into N paths, each path corresponding to a unit interval (UI) of the interleaved data stream;
the data stream includes any of a data signal (DQ) and a command/address (CA) signal streamed to the memory device; and
the memory device is contained in a memory module, the memory module including a Dual Inline Memory Module (DIMM).

18. A system comprising:
a memory device;
a host of the memory device;
an input/output (I/O) interface to divide a data stream into two or more paths through the memory device;
a mode register to store adjustment values programmed by the host of the memory device using a training feedback for local receiver reference voltages (local Rx Vrefs) per each of the two or more paths through the memory device, the training feedback including retrieval of data from the memory device;
a global Rx Vref value for all paths through the memory device, programmed by the host of the memory device using the training feedback for the local Rx Vrefs; and
circuitry to adjust a local receiver reference voltage (local Rx Vref) for a path of a data stream received in the memory device, including to:
obtain the global Rx Vref value for all paths,
access the mode register to obtain an adjustment value for the path of the data stream received in the memory device,
adjust the global Rx Vref value for all paths using the adjustment value to obtain an adjusted local Rx Vref for the path, wherein the adjusted local Rx Vref is to ensure a least number of errors in the data stream received in the memory device.

19. The system of claim 18, wherein the adjustment values were previously programmed by the host using the global Rx Vref value for all paths and adjusted local Rx Vrefs per each of the two or more paths through the memory device found to ensure a least number of errors in data exchanged between the host and the memory device, the adjustment values to compensate for a difference between the global Rx Vref and the adjusted local Rx Vref value for the path.

20. The system of claim 19, the adjustment values programmed by the host using the training feedback is an average of the adjusted local Rx Vrefs the circuitry determined for all paths, the average representing a midpoint of a range of the local Rx Vrefs per path for which a positive training feedback was received, wherein the positive training feedback matched known data for each path into which data streams for the local Rx Vrefs were divided.

21. The system of claim 20, wherein:
the training feedback includes results from a functional block of the memory device for the path into which the data stream was divided, the functional block including any of a dynamic random access memory (DRAM), a register clock driver ("RCD") and a data buffer; and the positive training feedback includes the training feedback matching expected results from the functional block of the memory device, the expected results including known data for the path into which the data stream was divided during training.

22. The system of claim 20, wherein the global Rx Vref value for all paths of the data stream was programmed by the host using any of the average of the adjusted local Rx Vrefs per path and a selected one of the adjusted local Rx Vrefs per path.

23. The system of claim 18, wherein:
the adjustment values stored in the mode register include one or more adjustment steps of a predetermined size and a sign bit; and
the circuitry to adjust the local Rx Vref includes circuitry to:
access the one or more adjustment steps of the predetermined size and the sign bit;
any of add to or subtract from the global Rx Vref value, based on the sign bit, the one or more adjustment steps of the predetermined size until reaching the adjusted local Rx Vref for the path found to ensure the least number of errors in the data stream received in the memory device.

24. The system of claim 18, wherein any of:
the training feedback was generated in a loopback circuitry of the memory device without having access to data retrieved from the memory device;
the data stream includes any of a data signal (DQ) and a command/address (CA) signal streamed to the memory device;
the memory device is contained in a memory module, the memory module including a Dual Inline Memory Module (DIMM); and
the memory device is an N-way interleave memory device in which the I/O interface to divide the data stream into two or more paths through the memory device includes an interleave circuitry capable of dividing an interleaved data stream into N paths, each path corresponding to a unit interval (UI) of the interleaved data stream.

* * * * *